United States Patent
Ahmed et al.

(10) Patent No.: US 11,940,633 B2
(45) Date of Patent: Mar. 26, 2024

(54) ILLUMINATOR WITH PHASE SCRAMBLING PARTICLES

(71) Applicant: INTEL CORPORATION, Santa Clara, CA (US)

(72) Inventors: Khaled Ahmed, Anaheim, CA (US); Liana Ilkova, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 757 days.

(21) Appl. No.: 16/916,576

(22) Filed: Jun. 30, 2020

(65) Prior Publication Data

US 2020/0333617 A1 Oct. 22, 2020

(51) Int. Cl.
| | |
|---|---|
| *G02B 27/48* | (2006.01) |
| *G06V 10/143* | (2022.01) |
| *G06V 10/145* | (2022.01) |
| *G06V 40/16* | (2022.01) |
| *H01S 5/34* | (2006.01) |
| *H01S 5/42* | (2006.01) |
| *G06V 40/18* | (2022.01) |

(52) U.S. Cl.
CPC ........... *G02B 27/48* (2013.01); *G06V 10/143* (2022.01); *G06V 10/145* (2022.01); *G06V 40/166* (2022.01); *H01S 5/423* (2013.01); *G06V 40/172* (2022.01); *G06V 40/197* (2022.01); *H01S 5/34* (2013.01)

(58) Field of Classification Search
USPC ........................................................ 372/12
See application file for complete search history.

(56) References Cited

U.S. PATENT DOCUMENTS

| | | | |
|---|---|---|---|
| 10,017,384 B1 | 7/2018 | Greer et al. | |
| 10,121,919 B2 | 11/2018 | Greer et al. | |
| 10,510,911 B2 | 12/2019 | Greer et al. | |
| 2006/0056021 A1* | 3/2006 | Yeo | G02B 5/0242 359/460 |
| 2018/0129866 A1 | 5/2018 | Hicks et al. | |
| 2019/0094564 A1* | 3/2019 | Rivera | G02B 27/48 |

OTHER PUBLICATIONS

Goodman, J.W., "Some fundamental properties of speckle", J. Opt. Soc. Am., vol. 66, No. 11, Nov. 1976.
Ruffing, B., "Application of speckle-correlation methods to surface-roughness measurement: a theoretical study", J. Opt. Soc. Am. A; vol. 3., No. 8; Aug. 1986.
Xie, Yi-Yang et al., "Metasurface-integrated vertical cavity surface-emitting lasers for programmable directional lasing emissions", Nature Nanotechnology, vol. 15, pp. 125-130, 2020.
Finisar Corp., "Application Note AN-2109 High Power VCSELs for Gesture Recognition" 2012.

* cited by examiner

*Primary Examiner* — Tuan N Nguyen
(74) *Attorney, Agent, or Firm* — Essential Patents Group, LLP

(57) ABSTRACT

An illuminator has phase scrambling particles to reduce speckle.

25 Claims, 12 Drawing Sheets

600

$d = 0.2\lambda$

620

$d = \lambda$

640

$d = 10\lambda$

Rayleigh Scattering 700

Mie Scattering 720

Mie Scattering, larger particles 740

→ Direction of incident light

```
EMIT IR OR NIR LIGHT FROM AN ILLUMINATOR HAVING AT LEAST
ONE LIGHT EMITTING LAYER AND MULTIPLE GROUPS OF
PHASE SCRAMBLING PARTICLES DEPOSITED ON THE LIGHT
EMITTING LAYERS, WHEREIN EACH GROUP HAS THE
PARTICLES SPACED FROM EACH OTHER, WHEREIN THE
MULTIPLE GROUPS COMPRISE INTENTIONAL VARIATION
BETWEEN AT LEAST TWO OF THE GROUPS IN AT LEAST ONE
OF: SIZES OF THE PARTICLES, AT LEAST ONE MATERIAL
FORMING THE PARTICLES, AND SPACING BETWEEN THE
PARTICLES 1102
```

```
WHEREIN THE ILLUMINATOR HAS A PLURALITY OF
ARRAYS OF VERTICAL-CAVITY SURFACE EMITTING
LASERS (VCSELS) EMITTING LIGHT, WHEREIN AT LEAST
TWO OF THE VCSEL ARRAYS HAVING DIFFERENT
DOMINATE WAVELENGTHS TO REDUCE SPECKLE,
WHEREIN INDIVIDUAL VCSELS HAVE THE LIGHT
EMITTING LAYER WITH AT LEAST ONE GROUP OF THE
PARTICLES 1104
```

ILLUMINATOR WITH PHASE SCRAMBLING PARTICLES

BACKGROUND

Projectors or illuminators are often used to project infrared (or near infra-red (NIR)) light (about 700 to 2500 nm wavelength) onto an object and then use a sensor (or camera) to detect the light reflecting from the object in order to form images of the object. The images then may be used for a number of applications including biometric detection for security authorization purposes such as with face detection or iris scanning recognition. These detection systems may be used to authorize a user to unlock many different objects such as computers, computer files, other electronic devices, or systems that trigger the unlocking of a physical device such as a door lock to name a few examples. Such NIR systems also may be used for eye tracking and other object detection operations such as with motion detection related games or artificial intelligence (AI), computer vision, and so forth. In these systems, the sensed reflections from the NIR illuminator are used to form an IR or NIR image with specific characteristics needed to perform the desired detection or to use the image for other applications. The cameras that generate images of a user's face to use the image to authorize access to something may be referred to herein as a face login camera.

The conventional NIR illuminator devices use LED illuminators. These conventional illuminators, however, often suffer from a loss of IR signal towards the edges and corners of the image due to fall off (e.g., reduced radiation intensity) of the illuminator, lens shading, and image sensor aperture limitations (where the aperture at the camera sensor is not wide enough to capture sufficient light near the edges of the aperture). At the same time, the center of the image may be too bright (too much light intensity or radiation) due to too much concentration of light at the center of the image, and so much so that the center of the image may be washed out by the light intensity.

It has been found that vertical cavity surface-emitting laser (VCSEL) illuminators resolve a number of these issues. The VCSEL provides a smaller and more controlled source of illumination with greater collimation as well as narrower emission wavelengths. This has become more important as time passed because more and more systems use hybrid cameras (RGB+IR) instead of two separate RGB and IR cameras to reduce cost and save space. A hybrid camera, however, will have fewer IR pixels compared to a separate IR camera. Thus, in order to meet the high quality demands of security applications, the IR image quality will require better infrared illumination that can be provided by the conventional VCSEL.

Specifically, a laser (such as the conventional VCSEL) emits monochromatic (single wavelength) light where waves are in phase with each other, and this can result in undesirable, severe, high-contrast speckle that forms blotches and spots on an IR or NIR image sufficiently severe so that it is difficult or even impossible to perform facial or other object detection analysis of the image. Also, it is typical to use multiple VCSELs on an illuminator that may have correlated speckle patterns that combine to form high contrast speckle where the difference between the dark and light speckle spots can be greater than with a single VCSEL. High contrast speckle results in high levels of noise in the image that can wash out the actual image data (or signal) such that the speckle limits the ability of an imaging system to resolve fine spatial detail on an image.

DESCRIPTION OF THE FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 11 is a flow chart for emitting light from an illuminator with phase scrambling particles and VCSEL arrays in accordance with at least one of the implementations described herein;

DETAILED DESCRIPTION

Figure 1:
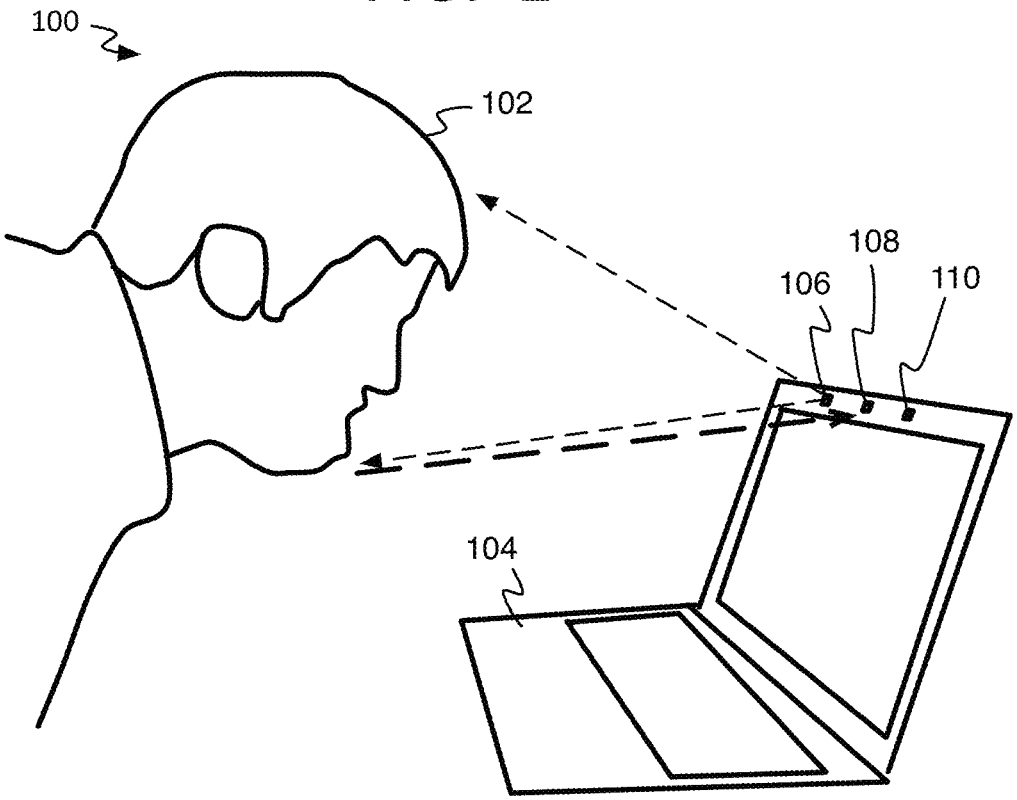
FIG. 1 is an illustration of a user using an example electronic device with a light projection and image capturing system being used for object detection and access authorization.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein, other than the specific structure of an illuminator described below, are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, televisions, cameras, laptop computers, tablets, and so forth, as well as dedicated access authorization devices either for access to an electronic device or otherwise mounted or placed at a variety of physical locations may implement the techniques and/or arrangements described herein. Further, while the following description may set forth numerous specific details such as logic implementations, types and interrelationships of system components, logic partitioning/integration choices, and so forth, claimed subject matter may be practiced without such specific details. In other instances, some material such as, for example, control structures and full software instruction sequences, may not be shown in detail in order not to obscure the material disclosed herein.

The material disclosed herein, other than the specific structure of the illuminator and sensor described below, may be implemented in hardware, firmware, software, or any combination thereof. The material disclosed herein also may be implemented as instructions stored on a machine-readable medium, which may be read and executed by one or more processors. A machine-readable medium may include any medium and/or mechanism for storing or transmitting information in a form readable by a machine (for example, a computing device). For example, a machine-readable medium may include read-only memory (ROM); random access memory (RAM); magnetic disk storage media; optical storage media; flash memory devices; electrical, optical, acoustical or other forms of propagated signals (e.g., carrier waves, infrared signals, digital signals, and so forth), and others. In another form, a non-transitory article, such as a non-transitory computer readable medium, may be used with any of the examples mentioned above or other examples except that it does not include a transitory signal per se. It does include those elements other than a signal per se that may hold data temporarily in a "transitory" fashion such as RAM and so forth.

References in the specification to "one implementation", "an implementation", "an example implementation", and so forth, indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described herein.

An illuminator with phase scrambling particles is described.

An infra-red (IR) illuminator may be used for biometric detection or other applications. For example, such biometric detection may be related to face recognition or iris illuminators and IR imaging systems including face login and other near infrared (NIR) centric techniques, usages, devices, and the like. Such techniques, usages, devices, and the like may require controlled NIR illumination to generate an image with the specific characteristics needed for face recognition or other usages.

Referring to FIG. 1, an example face login system 100 is shown where a user 102 faces an access authorization device 104, which in this example may be a computer or laptop with an IR illuminator (or projector) 106, and one or more cameras or sensors 108 and 110 that detects light projected from the IR illuminator and reflected from an object 102 to be detected such as the user's face. When one camera is being used, it may be an RGB-IR camera. Such an arrangement was conventionally performed by using an LED illuminator emitting NIR light. Also as mentioned, it has been found that to achieve a more desired radiation distribution pattern (or emission pattern), a vertical-cavity surface emitting laser (VCSEL) illumination source may be used instead of the LED, and which may offer a smaller and more controlled source of illumination with greater collimation as well as narrower emission wavelengths. Also, the VCSEL may provide a reduced emission angle that better matches the camera viewing angle to reduce waste at the outer limits of the angle that is outside the outer (or edge) image emission angle. Specifically, high-power VCSEL-arrays, for example, are excellent candidates for illumination applications as compared to LEDs because the spectral width of VCSELs is narrower than that of LEDs (1-2 nm vs. ~60 nm), and the efficiency of VCSELs is higher than that of LEDs (45% vs. 15%) as well.

The VCSEL by its nature, however, is a coherent light source and the use of the VCSEL results in an undesirable, severe, high-contrast interference pattern, or speckle. Laser (VCSEL) light is an inherently narrow band, and when a light source (such as the VCSEL) is, by its nature, coherent, it emits light at substantially a single wavelength at a single phase for example. When this light reflects off a rough surface, multiple paths of various lengths are generated between the illuminator and detector and the light from various paths may interfere with each other in the detector, combining in constructive or destructive manners. This combining works to form patches of higher intensity light due to the resulting constructive interference where light waves combine, and lower intensity light due to deconstructive interference where light waves subtract from each other. In an image detector with a finite camera aperture such as on camera sensors, and which are much like the human eye, a random interference pattern of these varied patches of intensity appear as optical "speckles," such as spots or blotches on the image that look brighter than other portions of the image. Further, this spot-to-spot intensity difference can vary depending on an observer's (or sensor's) position, which makes the speckles appear to change when the observer or sensor moves. The resulting images with speckle have varied colors with varied brightness in dots, blotches, and so forth where the constructive interference forms white spots and the deconstructive interference forms black spots. For example, experiments with human observers have shown that if speckle contrast is below 3% in a uniform picture, an average human observer will not notice the presence of speckle noise and there will be no degradation to the perceived picture quality.

One conventional way to reduce speckle is to overdrive the VCSEL, and by about 20% for instance. Overdriving refers to increasing the current providing the electrical field that produces the light propagation through the VCSEL. The greater the current, the more variation or range in wavelengths that can be produced by a VCSEL, resulting in reduced speckle. This, however, results in larger and costly power dissipation and results in heating up a camera module adjacent the VCSEL on the same image capture device. The heat impacts the camera performance (i.e., image quality) by degrading or otherwise influencing those camera components such as sensors that are sensitive to temperature, or requiring the use of more expensive thermal resistant materials. Thus, a better solution is desired to reduce speckle noise at lower power dissipation.

Another alternative to reduce speckle is to increase the number of emitters (or VCSELs) on a VCSEL array to reduce speckle noise. The more emitters, the greater the range of wavelengths of the light emitted by an array due to manufacturing tolerances. This structure alone, however, results in a larger footprint which is costlier (in terms of material and space) and undesirable for small form factors.

Yet another attempt at speckle reduction includes using one or more optical diffusers above each VCSEL on a light package and with the diffuser placed an optimized height above, and spaced from, a light emitting surface of the VCSEL. One example existing solution uses two diffusers (one integrated plus one air-spaced) and it increases the z-height of the package. These diffuser configurations, however, introduce a performance/size tradeoff forcing the package to be taller to hold the diffuser, which may be undesirable in many small form factors and may increase material and assembly costs as well.

Speckle reduction also has been achieved by using metasurface diffusers. In this case, however, forming a metasurface (or meta-layer) on a VCSEL requires expensive lithography and etching processes to manufacture the integrated VCSEL and diffuser.

To resolve these issues, an illuminator is disclosed herein that has phase scrambling particles, such as nanoparticles (where the diameter is about 1 nm to 100 nm) and other slightly larger particles, on a light emitting layer of the illuminator. By one form, the illuminator has one or more VCSELs, or may have one or more VCSEL arrays, each with a light emitting layer mounted with the particles. The particles form an integral diffusion layer and/or phase scrambler (or phase scrambling layer) of the illuminator or VCSEL that eliminates or reduces speckle while maintaining low cost, low power usage, and a small size illuminator (in both height and footprint). It should be noted that it is not always necessary to completely eliminate speckle. When mere low contrast speckle is present, either the speckle is sufficiently small so that image data (or signal) around the speckle is sufficient to reconstruct the image data (or is so small it is not needed), or the image data (or signal) can be discerned through the relatively dispersed, low-contrast speckle itself.

As to the particle arrangement, the pseudo-random placement of particles further increases phase shift scrambling, while the particles cause scattering, and in turn angular diversity, because each VCSEL in a VCSEL array will have a different arrangement of particles, thereby providing many different speckle patterns that will cancel (or average) each other out. The particles also can contribute significantly to beam shaping to raise the efficiency and effectiveness of the illuminator as explained below.

The speckle can be further reduced by providing multiple groups or patches of the particles with varying parameters from group to group. In other words, the use of the particles provides great flexibility in terms of varying the shape, size, and material compared to one-piece layers or metasurfaces (which is limited to one material and limited number of shapes). By one example, one group is provided on each light generating element in the illuminator. For example, one group may be provided for each VCSEL in an array of VCSELs. By another example, however, multiple groups are provided on a single VCSEL (or other light generating element), and in this case, the same multiple groups or a different mix of groups may be provided on individual VCSELs in an array of VCSELs. The groups have intentionally varying parameters from group to group that is more than mere manufacturing tolerance differences. For example, the particles may vary in size, material (and in turn, refractive indices), and/or spacing between particles and from group to group, although other parameters may be varied as well. This increases the differences (non-correlation) in speckle pattern from group to group, so that more of the speckle is averaged out. This is increased significantly when a single VCSEL has multiple groups so that many of the VCSELs each may emit light that is already patterned to significantly reduce speckle on its own in addition to the differences in speckle pattern from VCSEL to VCSEL. In addition, a combination of sizes and materials of the particles can be selected to achieve a more efficient beam shape.

The particles are formed on an illuminator by integrating a diffuser onto the light emitting layer of a light generating element, such as a VCSEL (although this could be other types of lasers for example). This may be considered a direct extension of the lithography and epitaxial growth chemical vapor deposition manufacturing processes of a VCSEL-array itself rather than expensive of lithography of a meta-layer, for example. The integration includes forming an upper light emitting layer of the VCSEL that can be bonded to the particles. By one form, covalent bonds are used to tie down a monolayer of the particles, thereby forming an integrated diffuser (or phase scrambling layer or phase scrambler). The particles can be deposited at room temperature so that energy, equipment, and material costs to provide heat for this stage are avoided. Also, the particles may be formed in a Spatial Liquid Phase Atomic Layer Deposition (SLP-ALD) process, and when multiple groups with varying parameters are being formed and used, then a selective area ALD process is used to form multiple groups on a single light generating element or one group per such element. These techniques avoid the high costs and complexity of expensive lithography or etching methods used when placing a metasurface (or metalayer) or other etched light directing or scattering layer on an illuminator.

In more detail, speckle reduction can be achieved as follows. When a surface is illuminated by a light wave, according to diffraction theory, each point on an illuminated surface acts as a source of secondary spherical waves. The light at any point in the scattered light field is made up of waves which have been scattered from each point on the illuminated surface. If the surface is rough enough (such as facial skin) to create path-length differences exceeding one wavelength, giving rise to phase changes greater than $2\pi$, the amplitude, and hence the intensity, of the resultant light varies randomly. If light of low coherence (i.e., made up of many wavelengths) is used, a speckle pattern will not normally be observed, because the speckle patterns produced by individual wavelengths have different dimensions and will normally average one another out. Thus, speckle contrast reduction (or generally, speckle reduction) is essentially the creation of many independent speckle patterns, so that they average (or cancel) out on the retina, or in this case on a camera's or detector's sensor.

Specifically, speckle reduction can be said to be based on averaging S independent speckle configurations within the spatial and temporal resolution of a detector (camera or sensor). It has been proven that, under the most favorable condition, where all the S independent speckle configurations have equal mean intensities, the contrast is reduced by a factor of $\sqrt{S}$.

The reduction in speckle by the averaging out of the speckle patterns can be achieved by having particles that cause phase scrambling. This occurs due to the resonance within the particles when the particles are relatively small compared to the wavelength of the light. Particularly, recent developments in the physics of high-index dielectric nanoparticles suggest the following mechanism of light localization: electric and magnetic dipole and higher-order multipole Mie resonances. For dielectric nanoparticles in particular, incident radiation brings both electric and magnetic responses of comparable strengths. The coupling of incoming light to the electric field's circular displacement current results in a strong magnetic dipole resonance, owing to the field penetration and phase retardation inside the particle. The magnetic resonance occurs when the wavelength inside the particle becomes comparable to its spatial dimension—that is, when $2R \approx \lambda/n$, where n is the refractive index of nanoparticle material, R is the nanoparticle radius, and $\lambda$ is the light's wavelength. This geometrically determined resonance suggests that the nanoparticle must have a relatively large refractive index to have resonances in visible and infrared (IR) spectral regions. Moreover, at the wavelength of magnetic resonance, the excited magnetic dipole mode of a dielectric nanoparticle may become comparable to, or even stronger than, the electric dipole response—and thereby provide a major contribution to the scattering efficiency. Finally, and importantly, the electric and magnetic dipoles are excited along the corresponding incident field components and perpendicular to each other. For spherical metallic nanoparticles, the electric dipole mode usually dominates the Mie scattering with a symmetric radiation pattern. By contrast, for dielectric particles, proposed here, the generation and interference of multipolar modes becomes important, and begins to enable nanoscale manipulation of light and exquisite control of the scattering direction. In a simplified picture, each particle can be considered as a "waveguide" that is truncated on all sides in the case of spherical particles and operates as a low-quality-factor Fabry-Pérot resonator. In the case of an ellipsoidal particles, the elliptical cross-section of the waveguide leads to different effective refractive indices of the waveguide modes polarized along the two ellipse diameters. As a result, each of the particles imposes a polarization-dependent phase shift on the transmitted light and modifies both its phase and polarization. In the regime of operation considered here, light is mainly confined inside the high-refractive-index particles, which behave as weakly coupled low-quality-factor resonators. Therefore, the light scattered by each particle is primarily affected by the geometrical parameters of the particle and has negligible dependence on the dimensions and orientations of its neighboring particles. Light scattering by high-refractive-index single dielectric scatterers has been studied previously, and it has been shown that they may possess strong effective magnetic dipoles and exhibit large forward scattering.

With the use of the particles then, averaging of speckle patterns happens on multiple levels. On a first level, small differences in size, shape, and resonance-inducing internal structure among particles and relatively random spacing of the particles deposited on a light emitting layer results in each particle providing a slightly different light pattern, and in turn speckle pattern, that can be averaged out. On another second level, the speckle pattern cooperatively formed by a group of particles on one light generating element (such as a VCSEL) will be different than the speckle pattern of another group of particles on another VCSEL and with varying parameters, thereby further averaging out the speckle patterns. In a third level, further concentrating the speckle pattern differences, a single light generating element (or VCSEL) may have the multiple groups so that each element already has two levels of speckle reduction so that speckle pattern averaging between VCSELs adds another level of speckle reduction.

Further, wavelength diversity provided by using multiple VCSEL arrays can add a fourth level of speckle reduction. On conventional VCSEL arrays, each VCSEL in the array tends to have very close to the same wavelength, less than 1 nm difference. This is due to the close proximity of the emitter elements within the array and the uniform wafer characteristics of the usually epitaxially grown laser structure. Therefore, the individual VCSELs in a conventional 2D VCSEL array (without the particles) form speckle patterns that are nearly identical. These patterns combine to form high contrast speckle. High contrast speckle results in high levels of noise in the image that can wash out the actual image data (or signal) such that the speckle limits the ability of an imaging system to resolve fine spatial detail on an image. When mere low contrast speckle is present, either the speckle is sufficiently small so that image data (or signal) around the speckle is sufficient to reconstruct the image data (or is so small it is not needed), or the image data (or signal) can be discerned through the relatively dispersed, low-contrast speckle itself. Low contrast can be achieved by providing each or individual VCSEL arrays a different wavelength such as equal to or more than 1 nm difference in wavelength to form sufficiently non-correlated speckle patterns that will average out.

As another particle feature, the particles also can be arranged to perform beam shaping to direct the light into a desired pattern. Particularly, the conventional VCSEL cannot provide desired intensity peaks on a far-field radiation distribution pattern (referred to as a M-shaped or bat-wing pattern) to provide a more uniform light intensity and SNR distribution throughout an image. This target bat-wing far-field radiation distribution is explained in detail by the U.S. patent application Ser. No. 15/793,795 filed Oct. 25, 2017, and published as U.S. Patent Publication No.: 2018/0129866, published on May 10, 2018, and which is incorporated herein in its entirety for all purposes. In addition to the far-field pattern, a continuous wave (CW) mode exists. In this mode, a VCSEL array has a radiation pattern that is a donut with a very dark center. Beam shaping may need to change the size of the donut or make the center brighter or make illumination uniform across imaging area depending on system requirements. In pulsed mode, the profile is different than these as well, so beam shaping should be different. Thus, to provide a more uniform light intensity throughout an image, particles also may be placed on each or individual VCSELs to direct light to form desired intensity peaks on the radiation distribution pattern. Thus, for the far-field example, the size and density of nanoparticles may be used to produce a batwing shaped radiation pattern at the target to compensate for non-ideal optical characteristics of the given imaging system. The particles reduce the undesired high light intensity in the center of the radiation pattern and forms intensity peaks nearer the outer edges of the pattern forming the M-shape or batwing shape. The result is that the particles provide a more uniform signal-to-noise (SNR) ratio, which also solves eye safety issues. Particles may be used to affect the other VCSEL radiation patterns as well.

These speckle reducing implementations result in ultralow speckle contrast, and in turn, can provide higher image quality and robust outdoor performance since reduced speckle will provide better light contrast detection. Since the particles form an integral phase scrambler (and/or diffuser), which may be a monolayer of particles, this solution provides a compact illumination system in terms of footprint and height of the VCSELs and in turn the illuminator, and lower power consumption since overdriving can be avoided. The saved power can be used for other modules of the object detection, other applications, or can simply provide the small-factor device with longer battery power.

Figure 2:
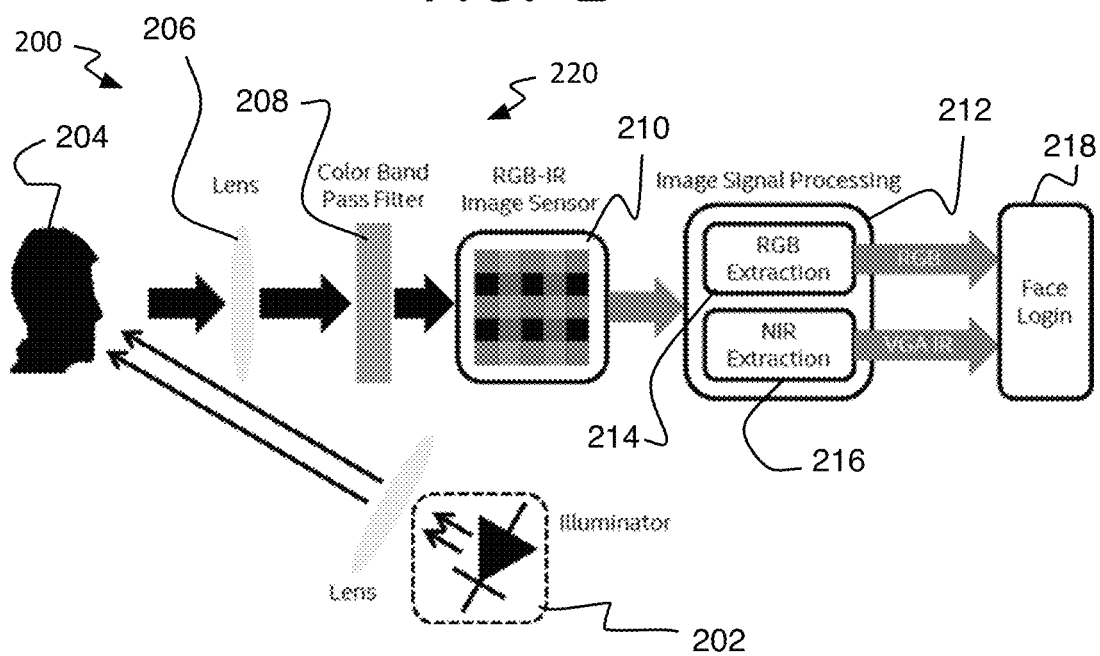
FIG. 2 is a schematic diagram of an example IR light projection, image capture and processing system in accordance with at least one of the implementations described herein.

Referring now to FIG. 2, an image processing system 200 may be used for facial or other object recognition according to one or more of the implementations herein. The image processing system 200 has an illuminator 202, and by one example with multiple light generating elements or light sources such as arrays of VCSELs as described herein. Alternatives could use one or more LEDs instead. The illuminator 202 is shown emitting light onto an object 204, such as a face but could be other objects. The light may be emitted in a desired far-field radiation pattern discussed herein as well. A camera 220 may receive the reflected light and may have imaging optics that receive the light emitted from the illuminator 202 and reflected from the object 204. The optics may include a lens 206 and an optical filter 208 such as a color band pass filter. The lens 206 may provide a light reception pattern, while the optical filter 208 may limit the spectral response of the camera. One or more hybrid RGB-IR sensors 210 are provided on the camera for this example but could be for monochromatic light such as IR instead. The sensor 210 may receive the light, as limited by the sensor's numerical aperture, and produce raw image data including RGB extracted data 214 and NIR extracted data 216 that is processed by an image signal processing unit 212. The data then may be used by an object detection unit (or here a face login unit for example) 218.

Figure 3:
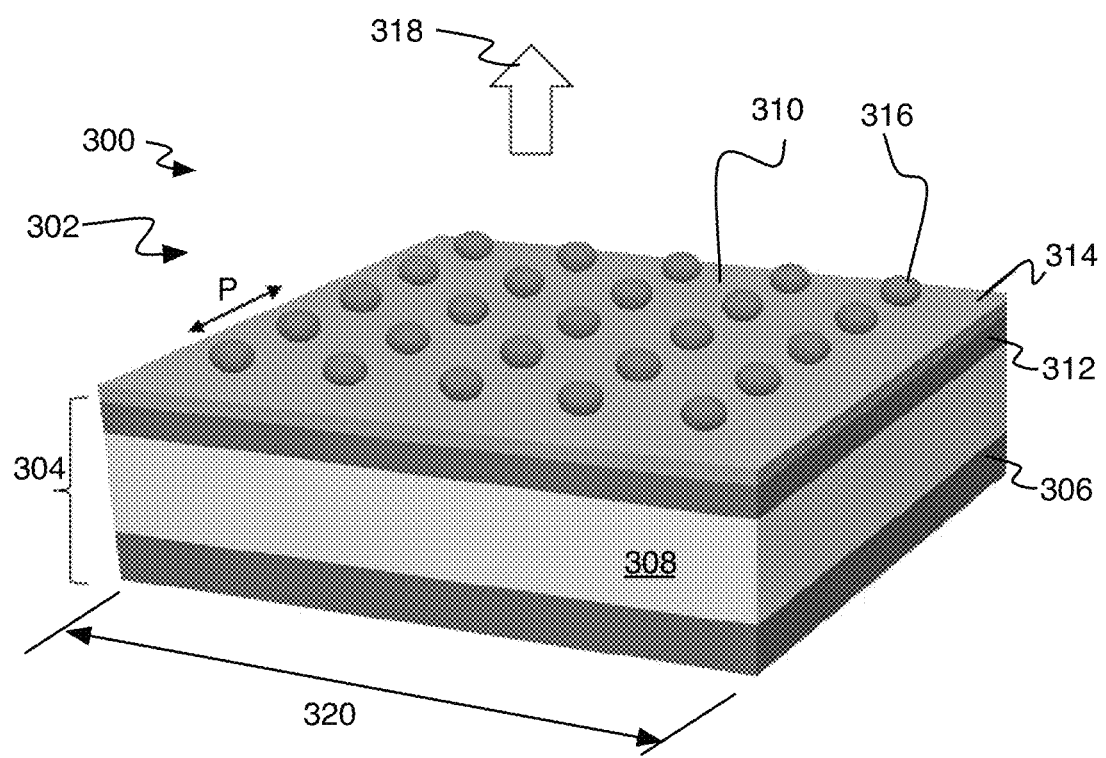
FIG. 3 is a cross-sectional perspective view of an illuminator with phase scrambling particles in accordance with at least one of the implementations herein.

Referring to FIG. 3, a light package or device (or illuminator) 300, such as illuminator 202, is used to emit light according to one or more implementations herein and has one or more light generating elements such as VCSELs in arrays described herein and where one of the VCSELs 302 is shown here. The VCSEL 302 may have a substrate mounted on an electrical contact, which in turn may be mounted on a body or casing of a package. The VCSEL 302 also may have a stack of layers 304 that generates and directs the light. This may include distributed Bragg reflector (DBR) (or mirror) layers 306 and 312 as well as an active region 308 of quantum well and barrier layers between two confinement layers by one example. The upper DBR layer 312 is below, and emits light to, a light emitting layer 314. A metal contact (not shown) may be mounted on the DBR layer 312 and may surround the light emitting layer 314.

The light emitting layer 314 may be integrated with particles 316 described herein on an upper light emitting surface 310 of the light emitting layer. The light emitting layer 314 may be considered to form the light emitting surface for the VCSEL and that emits light 318 from each VCSEL. On an array of VCSELs provided on an illuminator, each VCSEL may have its own light emitting layer 314 with particles 316 as shown on the single VCSEL 302 on illuminator 300. The light emitting layer 314 has a sufficient transparency to transmit light to the particles 316 as well as to emit the light from its upper surface 310. The light emitting layer 314 has a material such as $SiO_2$ and a thickness less than or equal to the wavelength of light and that is selected so that functionalization of the light emitting layer during SLP-ALD will bond the light emitting layer to functionalized versions of the particles. Other details of the light emitting layer 314 are provided below. This forms an integrated phase shift scrambling layer or just phase scrambler so that no diffuser need be spaced above the VCSEL, and in turn, so the illuminator or package 300 can be shorter than such conventional diffuser-using illuminators.

Figure 8:
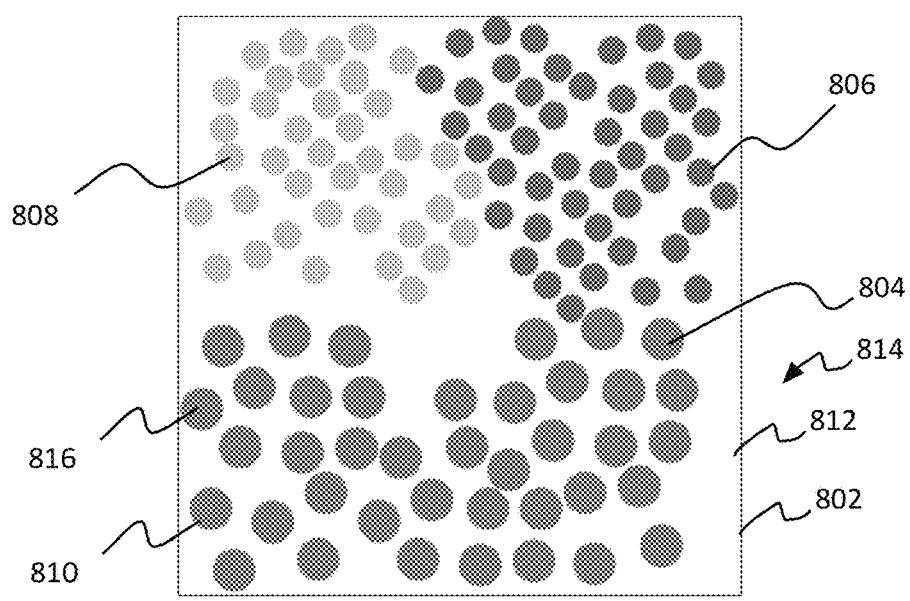
FIG. 8 is a schematic diagram of a simplified upper view showing groups of phase scrambling particles on an illuminator in accordance with at least one of the implementations herein.

The particles 316 may be nanoparticles with diameters of about 100 nm or less in diameter, while particles up to 650 nm or less in diameter may be used as well by one form. Other desired ranges are provided below. The particles may be substantially or generally spherical, ellipsoidal, or other shapes. While the particles 316 are shown in rows and columns with uniform spacing P, the particles 316 may be provided in a random arrangement where spacing P between particles is an average or other representative spacing value that can be controlled and modified, while the direction of the spacing (or in other words, an x and y 2D arrangement of the particles) can be random to obtain certain effects such as changing a speckle pattern or for beam shaping. By one approach, spacing P varies between about light wavelength $\lambda/2$ to wavelength $\lambda/1$, where light wavelength is that emitted by the light emitting layer 314 (without considering the particles). Other desired ranges are explained below as well. Also, the particles 316 on the light emitting layer 314 of a single light generating element 302 are shown here as either a single group or multiple groups as described below (FIG. 8).

With regard to beam shaping, the VCSEL 302 may provide a fall-off at outer wings of a bat-wing (or M-shaped) or other similar far-field radiation distribution pattern. The VCSEL creates steeper inclined outer ends of the pattern which reduces wasted power consumption that conventionally is used to form the pattern at the edges of an image, while the particles can be arranged to form raised peaks and a central valley between the peaks in the light intensity radiation pattern thereby resulting in a more uniform intensity and SNR pattern across a captured image. Such use of the VCSEL is explained in detail as disclosed by the '866 Publication cited above.

As to the reduction of speckle in addition to the speckle pattern averaging by the particles themselves, multiple VCSELs 302 may be provided in arrays with one array of the VCSELs emitting light in a dominant or mean wavelength different from that of another array of the VCSELs. A dominant wavelength refers to a mean, peak, or other representative wavelength of an array while the array actually may emit light in a range of wavelengths that could overlap with each other, as long as the difference in dominant wavelength from one array to the other is sufficient to reduce speckle. By one form, one array may have VCSELs with 2 μm apertures 320 to form a single wavelength mode while another array may have VCSELs with larger apertures 320 to form multiple wavelength modes (or multi-modes) as explained below.

The aperture is the effective diameter or width of the VCSEL that transmits light and is distinct from VCSEL to VCSEL. As for VCSEL 302, the diameter or width is the aperture 320 at the upper mirror (or DBR) layer 312, and at least the upper mirror layer 312 forms a VCSEL mesa (also referred to herein as a VCSEL element or just element or waveguide). Thus, in this configuration, more than one VCSEL mesa may share the same substrate or may have a separate substrate mesa it sits upon. When VCSEL mesas share the same substrate, it also may share one or more of the layers below the upper mirror layer 312 and above the substrate such as the lower mirror layer 306, active region 308 with confinement layers. By one approach, at a minimum, the VCSEL mesa or element provides a distinct diameter or width 320 relative to or adjacent such elements while having the light emitting surface 310 of the VCSEL as long as the element is light transmitting regardless of the light transmitting material forming the element layer or layers. Thus, the separate or distinct mesa or light generating element may not always be formed mainly of a mirror layer as here. This configuration of the VCSEL may be used as described in the implementations below.

Figure 4A:
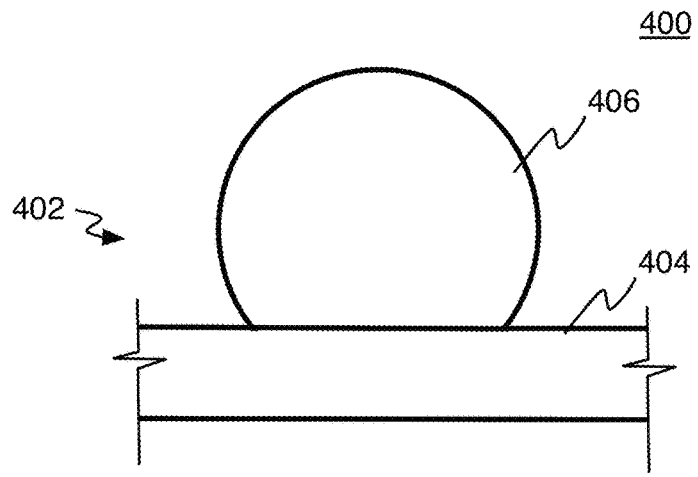
FIG. 4A is cross-sectional close-up view of a particle of a phase scrambler in accordance with at least one of the implementations herein.
Figure 4B:
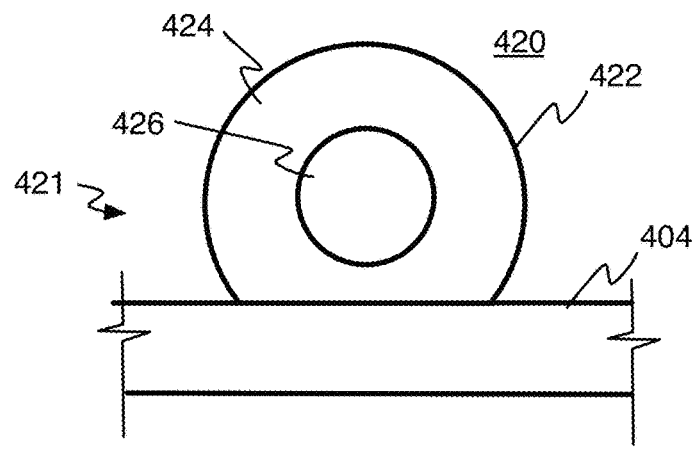
FIG. 4B is another cross-sectional close-up view of a particle of a phase scrambler in accordance with at least one of the implementations herein.
Figure 4C:
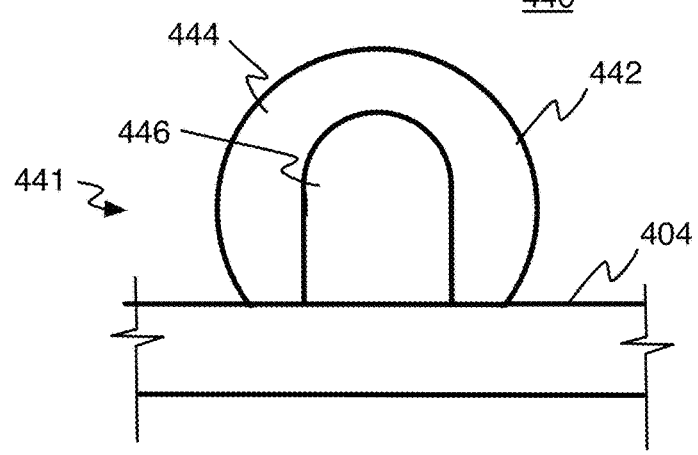
FIG. 4C is yet another cross-sectional close-up view of a particle of a phase scrambler in accordance with at least one of the implementations herein.

Referring now to FIGS. 4A-4C, the shape of the particles may be generally or substantially spherical or ellipsoidal. Illuminators 400, 420, and 440, each similar to illuminator 300, are shown with different particle configurations. Those items numbered the same in all three illuminators are the same or similar part. The illuminator 400, such as one or more VCSELs, may have an integrated diffusion layer (or phase scrambler) 402 formed of multiple particles 406 (one is shown) mounted on a light emitting layer 404 of an illuminator 400. The particles may form a monolayer with individual particles bonded to the light emitting layer, and by one example, with covalent bonds by using the SLP-ALD so that the phase scrambler 402 is integrally formed with the light emitting layer 404.

An illuminator 420 has a phase scrambler 421 that has particles 422 with an outer shell 424 and a core 426. By one example, the core 426 is dielectric formed of materials such as $TiO_2$ or doped $TiO_2$, $ZrO_2$ or doped $ZrO_2$ while the outer shell 424 may be a dielectric such as $TiO_2$ or doped $TiO_2$, $ZrO_2$ or doped $ZrO_2$. In this case, the shell 424 substantially or entirely surrounds the inner core 426. With this arrangement, the core-shell particles provide more knobs to control phase scrambling in addition to the refractive index and size of the particles. The details for forming particles with cores are provided below.

An illuminator 440 has a shell 444 and core 446 similar to illuminator 420 except in this case, the phase scrambler 441 has a core 446 that may be exposed through the shell 444 and may be directly bonded to the light emitting layer 404 as well as the shell 442. This arrangement provides flexibility in controlling the phase scrambling.

In other approaches, more than one core or inner layers may exist within the particle, such as one or more generally concentric core layers between an inner-most core and the outer shell.

It will be understood that the core-shell particles may be provided for all particles or some amount less than all particles. The core-shell particles may be provided on one or more groups (or patches) of particles that is less than all groups of particles. By one form, the variation from group to group may be the core-shell arrangement of the particles. Thus, a single illuminator with a single light generating element may have one or more of the particle configurations (no core and core-shell). Otherwise, the illuminator may have multiple or arrayed VCSELs, each with a different particle configuration, or individual VCSELs of the array may have a combination of different configurations each in a different group for example. As yet another alternative, a single group of particles (or each group) may have a combination of particle configurations (no core and core-shell) while the groups differ by some other parameter (such as size) from group to group.

Implementations are described herein with reference to cross-sectional view illustrations that are schematic illustrations of idealized implementations. As such, variations from the shapes of the illustrations as a result, for example, of manufacturing techniques and/or tolerances are expected. Implementations herein should not be construed as limited to the particular shapes of the regions or particles illustrated herein unless stated otherwise but are to include deviations in shapes that result, for example, from manufacturing. A region illustrated or described as rectangular, for example, will typically have rounded or curved features due to normal manufacturing tolerances. Also, the spherical particles shown here may not be completely or even substantially spherical and may be generally spherical. Thus, the regions illustrated in the figures are schematic in nature and their shapes are not intended to illustrate the precise shape of a region or particle.

As to the size of the particles, the sizes (diameters) of the nanoparticles, by one approach, can be about one quarter ($\lambda/4$) to one half ($\lambda/2$) of the operating nominal wavelength $\lambda$ emitted by the VCSEL array. In other words, wavelength $\lambda$ is a representative or dominant incident light wavelength emitted by the light emitting layer without factoring the effect of the particles.

In more detail, particle size and refractive index, which depends on the material of the particles, as well as the spacing of the particles from each other all significantly affect the scattering or angular diversity of the light and are related to each so that one must be selected depending on the other two. For example, when the particle size is large and comparable to the incident wavelength, Mie-type scattering is formed. A higher refractive index affects the light scattered that is set by an exact particle size-wavelength ratio where Mie scattering is dominant. Also, a random distribution of particles, as would occur with an ALD process described herein, will create a random distribution of beam angles, and in turn how much non-correlation exists between speckle patterns to reduce the speckle.

First, the physics of the optics should be understood to understand how to set these parameters. The phase is changed when the light is trapped inside the particle and resonance occurs as described above. Then, light is re-emitted with a different phase thereby establishing phase shift scrambling. Angular diversity is also a result of the light scattering due to the individual particles and groups of particles.

Also, there are generally three ways that light scattering particles (LSPs) scatter the light: reflection, refraction, and diffraction. Regarding reflection, the light of an LSP can be deflected back in the direction it came from or at an angle to the side, depending on where the light hits the particle. For purposes of scattering light that will eventually be emitted, sideways scattering is preferred to increase angular diversity and so that the amount of light reflected backwards (back-scattering) towards absorbent materials is reduced which decreases the light intensity.

With regard to refraction, the light of an LSP is emitted into an encapsulant medium where it interacts with LSPs distributed throughout the medium. As the light enters the LSPs, it changes speed, resulting in a change of direction and scattering.

With regard to diffraction, as light passes close by an LSP, the light bends around the LSP, deviating from its original path as it approaches the LSP. As the size of the LSP approaches the wavelength of the incident light, the phenomenon becomes significant. In this context, when the size of the LSPs approach one half the wavelength of the incident light, the light can bend approximately five times as much light as actually strikes the object. Thus, with an appropriately sized LSP, the diffraction area around the particle can be increased to approximately five times the diameter of the particle. To take advantage of the increased diffraction cross-section, the size of the LSP must be carefully chosen for light having a particular wavelength range or sub-range.

Figure 5:
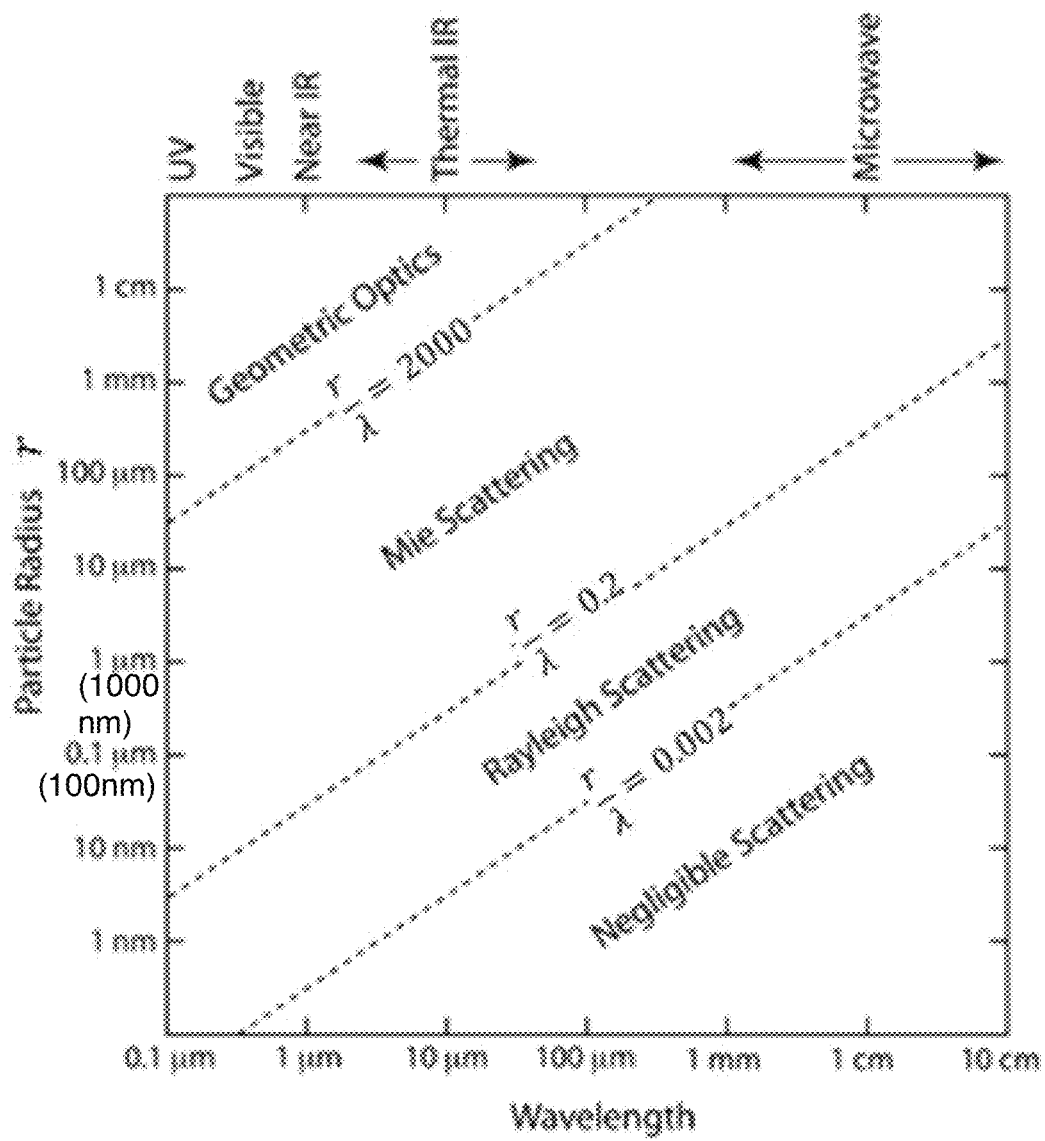
FIG. 5 is a graph of light scattering from particles.
Figure 6A:
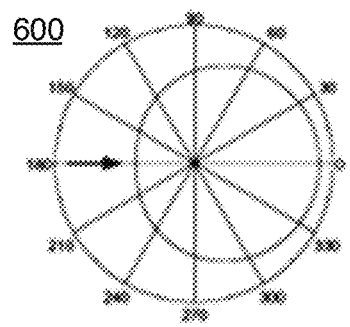
FIGS. 6A-6C are graphs of resulting light patterns of particles with different wavelengths.
Figure 6B:
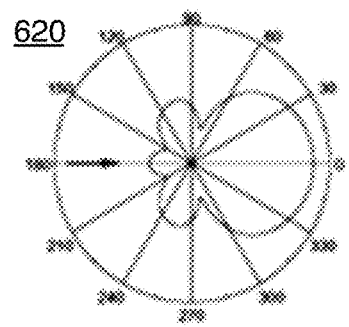
Figure 6C:
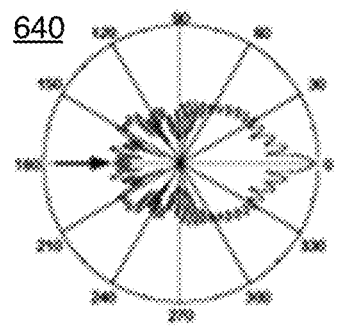

Referring to FIG. 5, the optic characteristics: reflection, refraction, and diffraction, affect the scattering and have been factored into the determination of known types of light scattering with particles such as Mie scattering (model) and Rayleigh scattering (model). Graph 500 shows when each of these types of scattering is present depending on the wavelength and particle sizes. (Note graph 500 shows radii where the discussion below is in diameters). Graph 500 shows the dominant scattering mechanisms of light by particles. Mie scattering is dominant for particles having sizes (radius r) of the order of the wavelength of incident light. For example, a blue light with wavelength of 460 nm will experience anisotropic scattering (i.e. Mie scattering) if the scattering particles have a radius between 40 nm and 800 nm. Particles of diameters less than 10 nm will by scattered isotropically according to the Rayleigh scattering model.

Referring to FIGS. 6A-6C and 7A-7C, Mie scattering diagrams 600, 620, 640 show different diameters (d) of scattering particles given in terms of incident light wavelength λ. When the size of the particles exceeds the threshold of λ/10 so that it is relatively closer to the wavelength size, then anisotropic Mie scattering occurs where the scattered light is unequal in energy (inelastic scattering) to the incident light and angle-dependent where the scattered light is most intense towards the direction of the incident light as shown on diagrams 600, 620, and 640 (and shown on diagram 720 (FIG. 7B) where the incident light is directed to the right. This size (diameter) threshold (λ/10) is due to the way electromagnetic waves (e.g., light) interact with a particle. By one approach, the Mie light scattering then is desirable for the phase scrambling particles disclosed herein since directing the light intensity in the direction of the incident light from the light generating element, or VCSEL, assists to maintain or increase the efficiency of the illuminator (where light beams in undesirable directions wastes energy).

By one approach here, the Mie scattering spherical particle size may be about 45 nm-650 nm diameters for incident wavelengths 180 to 2600 nm (λ/4). The particles may be about 125 nm (λ/4) to about 1250 nm (λ/2) for an IR or NIR wavelength range of about 700 to 2500 nm, or from 850 nm to 940 nm wavelength, or specifically at 850 nm or 940 nm for example. By another approach, the particle diameters are from about (λ/4) to λ. It should be noted that the larger the particle relative to the wavelength, the more light intensity is concentrated in the incident light direction as shown on diagrams 720 and 740 (FIG. 7).

Figure 7A:
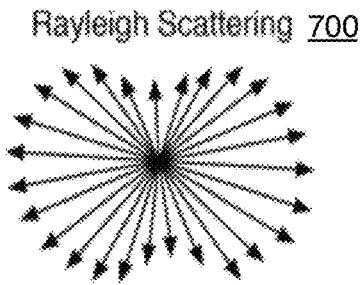
FIG. 7A-7C are graphs of different types of light scattering from particles.
Figure 7B:
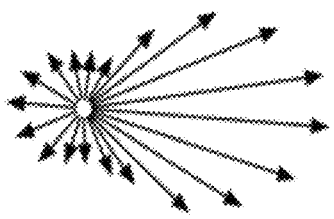
Figure 7C:
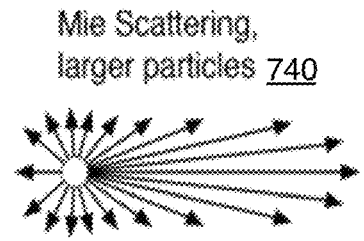

Referring still to FIGS. 7A-7C, and on the other hand, when the size of the particle is very small, such as having a diameter less than ¹⁄₁₀th of the wavelength of the incident light (i.e. λ/10), the scattered light carries the same energy (elastic scattering) to the incident light and is not angle-dependent. This is referred to as Rayleigh scattering. As shown on diagram 700, the light scatters more evenly in all directions rather than in the incident light direction. Nanoparticle spheres (or derivative shapes) may have diameters about 4 nm-15 nm in this case to form Rayleigh scattering. Generally, the Mie scattering is preferred for better quality images here.

Regarding the materials of the particles, materials that may be used for phase scrambling include indium phosphide (InP), gallium phosphide (GaP), aluminum oxide ($Al_2O_3$), titanium oxide ($TiO_2$), zinc oxide (ZnO), zirconium dioxide ($ZrO_2$), silicon dioxide ($SiO_2$), silicon (Si), hafnium oxide ($HfO_2$), or other materials that are transparent to infrared light (e.g. 850 nm or 940 nm wavelengths for example). The material of the light emitting layer may be any material, such as the ones mentioned here for the particle, that can form a transparent layer and that also can be functionalized for bonding with the particles as described below.

The material of the particles, and their corresponding refraction indices, used for Mie scattering may include $TiO_2$, doped $TiO_2$, $ZrO_2$, or doped $ZrO_2$. These material also may form the core of a core-shell particle structure, and particularly a dielectric core. The shell may be formed of $TiO_2$, doped $TiO_2$, $ZrO_2$, or doped $ZrO_2$ whether the same or different than that of the core. Other materials may work as well.

The material of the particles, and their corresponding refraction indices, used for Rayleigh scattering may include $ZrO_2$, doped $ZrO_2$, $TiO_2$, and/or doped $TiO_2$.

Referring to FIG. 8, as mentioned above angle diversity can be achieved by varying the size, materials, and spacing of the particles among different groups or patches of the particles in order to form multiple speckle patterns that will cancel each other out. For example, an illuminator 800 may have a light emitting surface 802 of a light emitting layer 812 that emits light of a light generating element 814 such as a VCSEL. The light emitting surface 802 has particles 804 forming a phase scrambling layer 816 integrally formed onto, and with, the light emitting layer 812. A first group (or patch) 806 of the particles may have particles with a first size (diameter) and first spacing where the spacing may be an average, median, or other representative spacing of the group. A second group 808 may have particles with a second size (diameter) and spacing. A third group 816 may have particles with a third size (diameter) and spacing, and so forth.

One equation for angular diversity to reduce speckle between two different speckle patterns is:

$$\gamma_{12}^A = \exp(-\sigma_h^2 \sin^2 \alpha_1 k^2 \delta \alpha^2) \quad (1)$$

where γ is angular speckle correction (or degree of correlation of speckle intensities), 12 refers to speckle patterns 1 and 2 being compared, $\sigma_h$ refers to surface roughness of an object reflecting projected light, $\delta_\alpha$ refers to difference in incident angle, k refers to wave vector, and α refers to incident angle. See Ruffing, B., *Application of Speckle-correlation Methods to Surface-roughness Measurement: A Theoretical study*," J. Opt. Soc. Am. A, 3, pp. 1297-1304 (1986). By setting a desired threshold correlation (where the lower the correlation, the more speckle reduction results), equation (1) reveals a desired difference in incident light angle from different patches of particles that can be obtained by increasing surface roughness (which may not be possible) or increasing the difference in angle of the incident light from the sources creating the speckle patterns that are being compared. The particles can be formed to produce that difference in incident angle emitted from the illuminator.

The change in incident angle may be achieved by variations, to name a few examples, such as having one group with particles of a size of $\lambda/4$ and another group with particles of a size of $\lambda/2$; and/or having particles of one group being formed of Si with a refraction index of 3.5 while another group may have particles formed of $TiO_2$ with a refraction index of 2.5; and/or having particles spaced apart by $\lambda/2$ and another group having particles spaced apart by $\lambda$.

As mentioned above, multiple groups 806, 808, 816 for example may exist on an illuminator with one group for each light generating element (VCSEL). By a different approach, individual or each light generating element may have multiple groups of the particles that each form a speckle pattern that cancels (or averages) the other speckle patterns out. Other details for supporting the particles on a VCSEL array are mentioned below.

As the shape of the area covered by a group, this may be somewhat random due to the ALD process described herein. The total area may be controlled. As shown on illuminator 800, the groups 806, 808, and 810 each have their own section of the light emitting layer 812 forming or filling a continuous area such as being generally quadrilateral, triangular, or polygonal for example. Other alternatives could be used, however, such as groups arranged in rows on the light emitting layer 812, more curved areas or non-solid group areas such as generally concentric ring (or annulus) shaped groups, and circle segments, sectors, or cusps, for example.

The groups also could be divided or scattered through-out a light emitting layer. Another way to describe this is to state that multiple separate groups may have the same first set of parameters while other multiple separate groups have a different second set of parameters, and so on. There is no particular limit to the shape of the area covered by a group and the random placement of the particles themselves may be permitted to define its own area.

Figure 9:
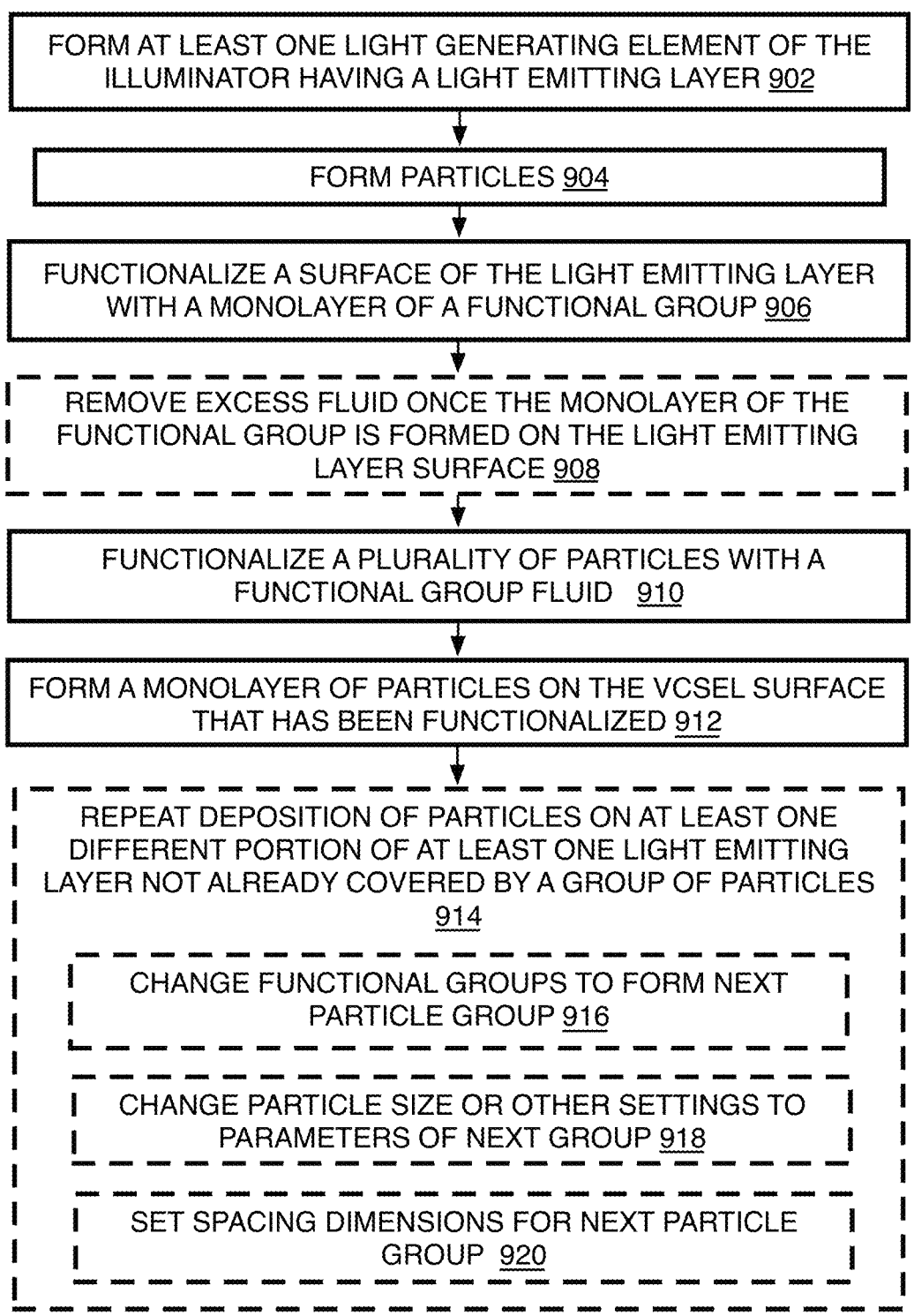
FIG. 9 is a flow chart of a method of forming an illuminator with phase scrambling particles in accordance with at least one of the implementations herein.

Referring to FIG. 9, an example process 900 for forming a light emitting device is arranged in accordance with at least some implementations of the present disclosure. Process 900 may include one or more operations 902-920 numbered evenly. Process 900 may form at least part of illuminators as shown at FIGS. 2-4C and 15. Furthermore, process 900 may be described in reference to system 1500 of FIG. 15, and where relevant.

Process 900 may include "form at least one light generating element of the illuminator having a light emitting layer" 902, and this may include forming at least one VCSEL or one or more VCSEL arrays to form the illuminator. Lithographic, chemical vapor deposition, epitaxial growth, or other techniques may be used to form the VCSELs or arrays of VCSELs each with a structure similar to the structure of illuminator 300 (FIG. 3). The VCSEL may emit infra-red (IR) or near-infra-red (NIR) light. As mentioned above, the VCSELs of one array may be formed with apertures that are a different size than apertures of VCSELs of at least one other array so that the dominant wavelength of the one array and other array is sufficiently different to reduce speckle as described below.

The particles may be deposited on the light emitting surface of a VCSEL or a VCSEL array using Spatial Liquid Phase Atomic Layer Deposition (SLP-ALD). By one example form, the method of placing nanoparticles on the surface of the VCSEL is as follows.

Process 900 may include "form particles" 904, and as mentioned above, this may include forming solid particles, particles with a core entirely embedded in a shell, and/or a particle with an exposed core. The core maybe formed as a dielectric core with a dielectric shell, and in one form, with different refractive indices. By one form, the core has a lower refractive index than that of the shell. For a solid particle, the particles may be formed by many different manufacturing processes whether by milling or other chemical processes. One example is ball milling. Core particles can be coated with a shell layer using CVD or ALD process or any other colloidal processing method. The particles may be nanoparticles (under 100 nm diameter) or larger depending on the incident wavelength as mentioned above.

Process 900 may include "functionalize a surface of the light emitting layer with a monolayer of a functional group" 906, and this may be performed by contacting a fluid to the VCSEL surface" 906. The light emitting layer may be functionalized with —$CH_3$ or methyl groups, by one example. Other substrate/light emitting layer functionalization groups could be used.

Process 900 may include "remove excess fluid once the monolayer of the functional group is formed on the light emitting layer surface" 908. This better ensures a monolayer of the particles will adhere to the light emitting layer.

Process 900 may include "functionalize a plurality of particles with a functional group fluid" 910. The functional group chosen to functionalize the particles is chosen so as to attach to the functional group of the light emitting layer. By one example, the particles are functionalized with —OH or other alcohol groups. Other particle functionalization groups could be used.

Process 900 may include "form a monolayer of particles on the VCSEL surface that has been functionalized" 912, and this may be performed by contacting the functionalized plurality of particles to the functionalized VCSEL surface, and attaching the functional group on the particles to the functional group on the VCSEL surface, thereby forming a covalent bond. Specifically, the methyl groups on the light emitting layer surface react with the alcohol or —OH group on the functionalized particles to form a substrate-oxygen-particle (substrate-AL-O-particle) covalent bond. Also, this can be performed without intentionally raising the temperature above room temperature (above about 68-78° F. for example), thereby reducing costs of the process compared to etching or forming metasurfaces for example.

Other details for depositing nanoparticles is disclosed by U.S. Pat. No. 10,017,384, ('384 patent), issued Jul. 10, 2018 for "Property Control of Multifunctional Surfaces", which is incorporated herein for all purposes ('384 patent).

Process 900 optionally may include "repeat deposition of particles on at least one different portion of at least one light emitting layer not already covered by a group of particles" 914, and when multiple particle groups or patches are being used. As described herein, when multiple light generating elements (or light sources or VCSELs for example) are being used on an illuminator, one group may be provided for each element. Otherwise, multiple groups may be deposited on a single element, or more particularly on a light emitting layer on an aperture defining a separate element.

The deposition of the particles is performed by Selective Area (SA) ALD. The functional group (or functional solution or precursor) of the particles is paired with a functional group or solution of the light emitting layer that will react with the particle's functional solution. Multiple paired functional solutions can be selected where the solution only reacts to its paired solution but will not react to other solutions of other pairs. Thus, a first pair of functional solutions may be used to bond a first group of particles to a first area of the light emitting layer. Then, a second pair of functional solutions may be used for a different area on the light emitting layer to attach a different group of particles to the light emitting layer, and so on. The particles will not attach (or bond) to other areas of the light emitting layer that are not functionalized or are functionalized with a solution of a different pair. This avoids substantial overlap of groups (ignoring manufacturing tolerances), and avoids the need for expensive masking operations or aiming the chemical deposition to particular parts of a light emitting layer to avoid the overlap of the groups. The pairing of the functionalizing agents is disclosed by the '384 patent cited above.

This operation optionally may include "change functional groups to form next particle group" 916 when the particles are to be formed of a different functional group to prevent bonding over other group areas.

Next, this operation optionally may include "change particle size or other settings to parameters of next group" 918 when the particles are to be formed of a different size. Particles can be pre-manufactured at different desired sizes. Other settings or parameters that could be varied include the number of particles in the group, the shape of the particles, particle configuration (solid, covered core-shell, exposed core as described above with FIGS. 4A-4C), and so forth.

Also, this operation optionally may include "set spacing dimensions of next particle group" 920 when the particles are to be formed of a different spacing between particles.

The process above (operations 904 to 912) then may be repeated to bond and integrally form the particles on the light emitting layer. These operations repeat (914 to 920 and then 904 to 912) for each group of particles to be deposited on light emitting layers.

Figure 10:
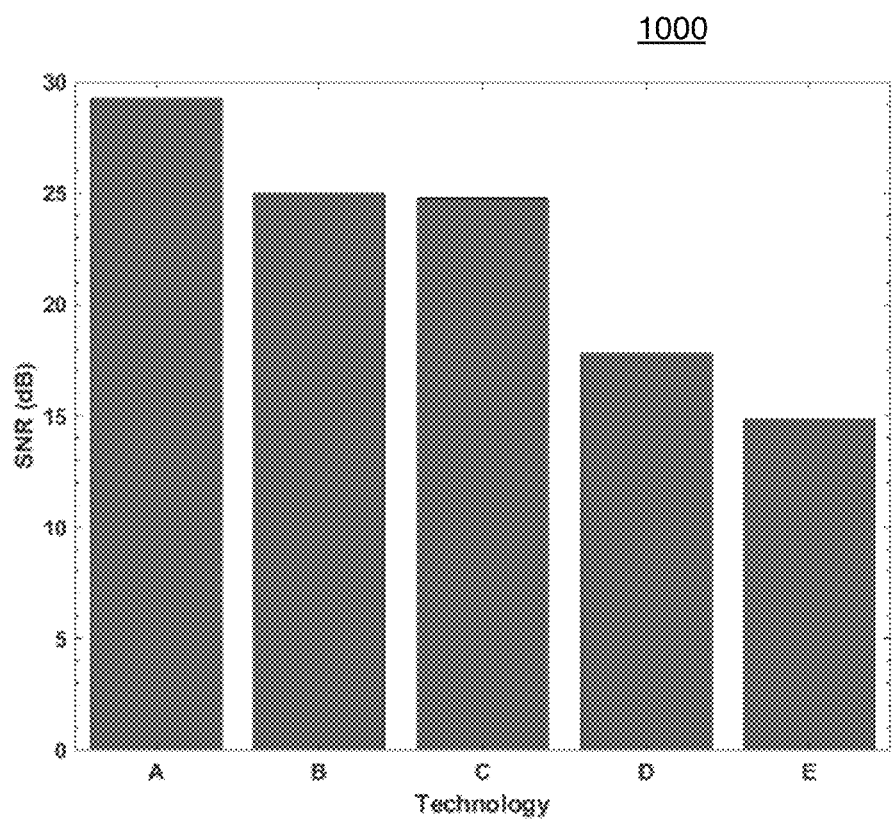
FIG. 10 is a graph comparing resulting noise of different illuminator implementations.

Referring to FIG. 10, simulated experimental results are based on operation (or specifications) of five different illuminators A to E. The illuminators involved are as follows:
- A: LED illuminator assuming ideal specified results,
- B: VCSEL illuminator with nanoparticles as described herein as a phase scrambling diffusion layer as well as a beam shaper,
- C: VCSEL illuminator without particles,
- D: VCSEL illuminator with a conventional diffuser, and
- E: VCSEL illuminator with a conventional diffuser and conventional phase scrambler. The phase scrambler here is a different optical element from the diffuser. This increases the height of the illuminator and creates safety issues due to too much radiation.

Experimental data (A, C, D, and E) and projected performance of this proposed solution (B) is shown. The advantage of the present illuminator disclosed herein is that the diffuser optical element and angle diversity optical element are made using the nanoparticles so that the illuminator B costs less than illuminator C and is more efficient.

The bar chart 1000 shows speckle signal to noise ratio (dB) for each of the five illuminators. As mentioned above, where all the S independent speckle configurations have equal mean intensities, the contrast is reduced by a factor of $\sqrt{S}$. If using particles as disclosed herein, the speckle contrast noise can be reduced by 2× compared to illuminator A, which translates into about 10 dB (difference between the noise for A (30 Db) and B (25 Db) times two for positive and negative signal) as shown in this bar chart 1000.

With regard to a VCSEL array, single transverse mode laser diode arrays have been desirable for creating high power laser diode sources capable of achieving both high beam quality and spectral control. The transverse mode is the number of separate dominant light wavelengths (in nm for example) emitted by an array of the VCSELs. Here, VCSELs can achieve single mode output using elements with small apertures (e.g., about 2 μm or less) measured at the distinct upper element (such as the upper DBR layer 312) of the VCSEL as described above on VCSEL 302 (FIG. 3).

Figure 12:
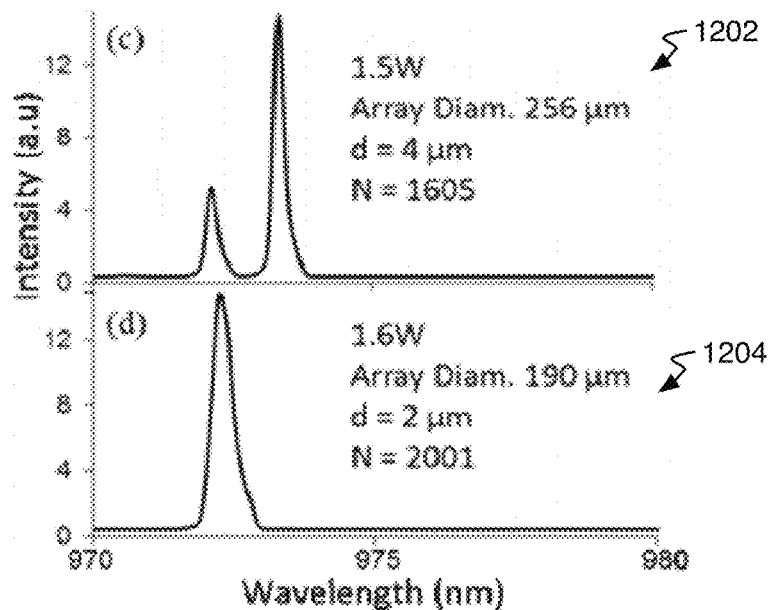
FIG. 12 shows two graphs showing light wavelength variation from VCSEL arrays.

Referring to FIG. 12, as an example, two graphs 1202 and 1204 show lasing spectra of a single aperture device the various element size arrays, where N is the number of distinct VCSEL elements in the array, W is power in watts, and d is the emitting VCSEL diameter (also referred to as the VCSEL's aperture) of each element. The number of transverse modes (shown by each peak) decreases with element VCSEL diameter d, with the d=2 μm element emitting only a single transverse mode on graph 1200. However, if the element is relatively wide at the diameter/aperture of the VCSEL up to 4 μm, then the element can support multiple transverse optical modes, and the laser is known as "multimode" as shown on graph 1202. A single transverse mode VCSEL array based on a lithographic fabrication technique enables good packing density and laser element uniformity.

Lithographic VCSELs have proven to be superior to oxide-aperture VCSELs in numerous properties, most notably for small sizes. Such benefits include high power conversion efficiency and low thermal resistance, increased reliability, as well as stable single transverse mode output. Achievements in improved beam quality and spectral control allow these lithographic arrays to avoid the 'donut' mode pattern seen in arrays made with larger VCSEL elements.

Figure 13:
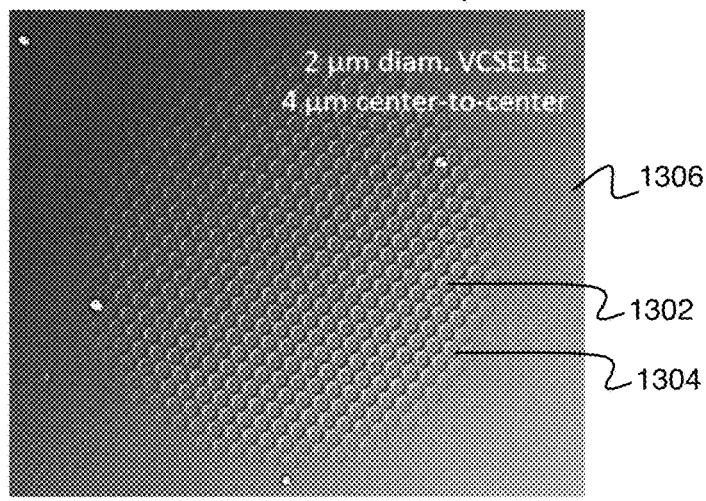
FIG. 13 is a schematic diagram of a simplified top view of a VCSEL illuminator showing a VCSEL array in accordance with at least one of the implementations herein.

Referring to FIG. 13, an example illuminator 1300 has an example VCSEL array 1302 formed of individual lithographic VCSELs 1304 visible at their elements on a substrate 1306. The VCSEL elements may be 2 μm diameter single transverse mode VCSELs 1314 spaced 4 μm center-to-center. The VCSEL elements have high uniformity in their size and operation.

Referring to FIG. 11, angular beam divergence also can be increased by using arrays of VCSELs as a fourth level cost-effective speckle reduction as mentioned above and by providing wavelength diversity. An example process 1100 for emitting light to capture images is arranged in accordance with at least some implementations of the present disclosure, and specifically, for example, while using both phase scrambling particles and multiple VCSEL arrays on an illuminator. Process 1100 may include one or more operations 1102-1104 numbered evenly as illustrated in FIG. 11. Process 1100 may be described herein with reference to systems or illuminators 200, 300, 400, 420, 440, or 1500 of FIG. 2-4C or 15 respectively, and where relevant.

Process 1100 may include "emit IR or NIR light from an illuminator having at least one light emitting layer and multiple groups of phase scrambling particles deposited on the light emitting layers, wherein each group has the particles spaced from each other, wherein the multiple groups comprise intentional variation between at least two of the groups in at least one of: sizes of the particles, at least one material forming the particles, and spacing between the particles." 1102. By one form, an illuminator comprising at least one light source has a stack of layers comprising a layer with a light emitting surface. The light source is a monochromatic light source, and in one form, is an infra-red (IR) or near-infra-red (NIR) illuminator.

Process 1100 may include "wherein the illuminator has a plurality of arrays of vertical-cavity surface emitting lasers (VCSELs) emitting light, wherein at least two of the VCSEL arrays having different dominate wavelengths to reduce speckle, and wherein individual VCSELs have the light emitting layer with at least one group of the particles" 1104. The illuminator comprises a vertical-cavity surface emitting laser (VCSEL). By one form, each or individual VCSEL has a single group. By another form, each or individual VCSEL has multiple groups.

Figure 14:
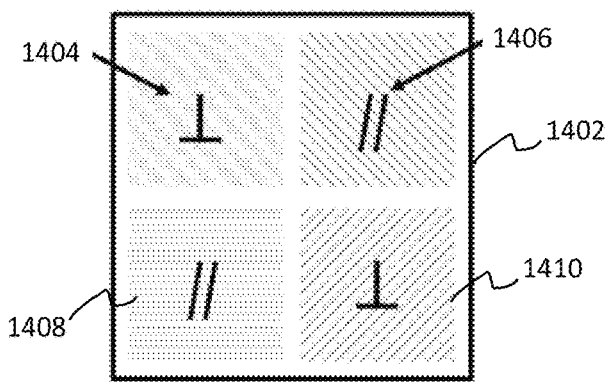
FIG. 14 is a schematic diagram of a simplified top view of an illuminator with multiple VCSEL arrays in accordance with at least one of the implementations herein.

Referring to FIG. 14 for more detail, the use of multiple VCSEL arrays with varying wavelength parameters can add wavelength diversity to further reduce speckle. Wavelength diversity is the use of laser sources which differ in wavelength by a small amount. A speckle pattern depends on the wavelength of the illuminating light. The speckle patterns from two beams with different wavelengths become uncorrelated if the average relative phase-shift created by the surface is ≥2π. Thus, the wavelength difference should be:

$$\delta\lambda \geq \lambda^2/2z \qquad (2)$$

where z is the surface profile height variation of the illuminated surface. For example if wavelength λ=0.85 μm and height variation z=0.1 mm, the wavelength difference should be ≥3.6 nm.

By one example approach, the light emitted by at least one of the arrays with VCSELs of one or more aperture sizes may be different than the aperture size or sizes of VCSELs of at least one other of the arrays so that the at least one array emits light at a dominant wavelength different than the dominant wavelength of the at least one other array. As described herein, this is accomplished by using different VCSEL aperture sizes on one array of the VCSELs compared to another array of the VCSELs. By one form, apertures on the arrays may vary from array to array on sizes from about 1 μm to 10 μm, and in one example, one array has apertures of about 2 μm while the aperture of other arrays may be larger such as 3 or 4 μm (other sizes could be fractions of these such as 2.5 μm, etc.). By one example, the difference in apertures from array to array may be set to cause at least 1 nm difference in dominant wavelength.

An example illuminator 1400 is shown with a substrate 1402 and four VCSEL arrays 1404, 1406, 1408, and 1410 on the substrate 1402, where each array may have VCSELs with a different size aperture. In another example as shown here, a pair of diagonally positioned arrays 1404 and 1410 may have the same or similar aperture size, and in turn, the same or similar dominant wavelength, while arrays 1406 and 1408 may have the same or similar dominant wavelength that is different than that of the other two arrays. Thus, the waves, and in turn the speckle patterns, will average out instead of adding or subtracting from each other, thereby reducing speckle. Many other variations are contemplated as long as least two arrays have different wavelengths. Thus, a check pattern may be continued as arrays are added where diagonally disposed arrays have the same wavelength. Otherwise, such differences could be arranged by row or column instead rather than diagonally.

By another example form, each array of the illuminator 1400 is the same size and shape with the same number of VCSELs, and by one example, in the same row and column arrangement, here forming squares or rectangles. Each VCSEL array 404, 406, 408, and 410, by one option, has a different dominant wavelength. According to this example, each dominant wavelength is at least about 1 nm different than any of the other dominant wavelengths of the other arrays. By one example, the dominant emission wavelengths of each array may be within about 4 nm of a wavelength of 850 nm or 940 nm.

While illuminator 1400 is shown with only four arrays, any number of multiple arrays such as two to six arrays may be used. By one form, a VCSEL array pattern of 3×2 arrays may be used where each array has VCSELs with a different aperture size than the size of the apertures of VCSELs of a different array, and in turn, different wavelength. By other forms, 3×3 or even 3×4 arrays could be used. As mentioned, the speckle may be reduced by $1/\sqrt{S}$ where S is the number of arrays (or number of speckle patterns). Despite the number of arrays here up to six, this still creates a much smaller footprint than would the total number of VCSELs needed to reduce speckle by providing a sufficient variation in speckle patterns simply by relying on the manufacturing tolerances of the VCSELs.

It will be understood that the VCSELs of one array being formed with the same one aperture includes manufacturing tolerances for that aperture measurement or may include an intentional range of aperture sizes for a single array that form a desired dominant wavelength (which may or may not be the average wavelength or a peak wavelength) for that array. Other variations are contemplated.

As to the placement of the particles on the VCSEL arrays, by one form, all of the VCSELs may have particles with the same parameters. Otherwise, each VCSEL array may have a different particle group, or each VCSEL array may have multiple particle groups. Other combinations may have VCSEL arrays with the same wavelength having the same particle group, or the opposite could be used where VCSEL arrays with the same wavelength have a different particle group but VCSEL arrays with different wavelengths have the same particle group. Many other variations are contemplated.

In addition, any one or more of the operations represented by the processes or explanations with FIGS. 10-11 may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more processor core(s) may undertake one or more of the operations of the example processes herein in response to program code and/or instructions or instruction sets conveyed to the processor by one or more computer or machine-readable media. In general, a machine-readable medium may convey software in the form of program code and/or instructions or instruction sets that may cause any of the devices and/or systems to perform as described herein. The machine or computer readable media may be a non-transitory article or medium, such as a non-transitory computer readable medium, and may be used with any of the examples mentioned above or other examples except that it does not include a transitory signal per se. It does include those elements other than a signal per se that may hold data temporarily in a "transitory" fashion such as RAM and so forth.

As used in any implementation described herein, the term "module" refers to any combination of software logic and/or firmware logic configured to provide the functionality described herein. The software may be embodied as a software package, code and/or instruction set, and/or firmware that stores instructions executed by programmable circuitry. The modules may, collectively or individually, be embodied for implementation as part of a larger system, for example, an integrated circuit (IC), system on-chip (SoC), and so forth.

As used in any implementation described herein except where specifically described above, the term "logic unit" refers to any combination of firmware logic and/or hardware logic configured to provide the functionality described herein. The "hardware", as used in any implementation described herein, may include, for example, singly or in any combination, hardwired circuitry, programmable circuitry, state machine circuitry, and/or firmware that stores instructions executed by programmable circuitry. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the systems discussed herein. Further, one of ordinary skill in the art will appreciate that operations performed by hardware and/or firmware may also utilize a portion of software to implement the functionality of the logic unit.

As used in any implementation described herein, the term "engine" and/or "component" may refer to a module or to a logic unit, as these terms are described above. Accordingly, the term "engine" and/or "component" may refer to any combination of software logic, firmware logic, and/or hardware logic configured to provide the functionality described herein. For example, one of ordinary skill in the art will appreciate that operations performed by hardware and/or firmware may alternatively be implemented via a software module, which may be embodied as a software package, code and/or instruction set, and also appreciate that a logic unit may also utilize a portion of software to implement its functionality.

Figure 15:
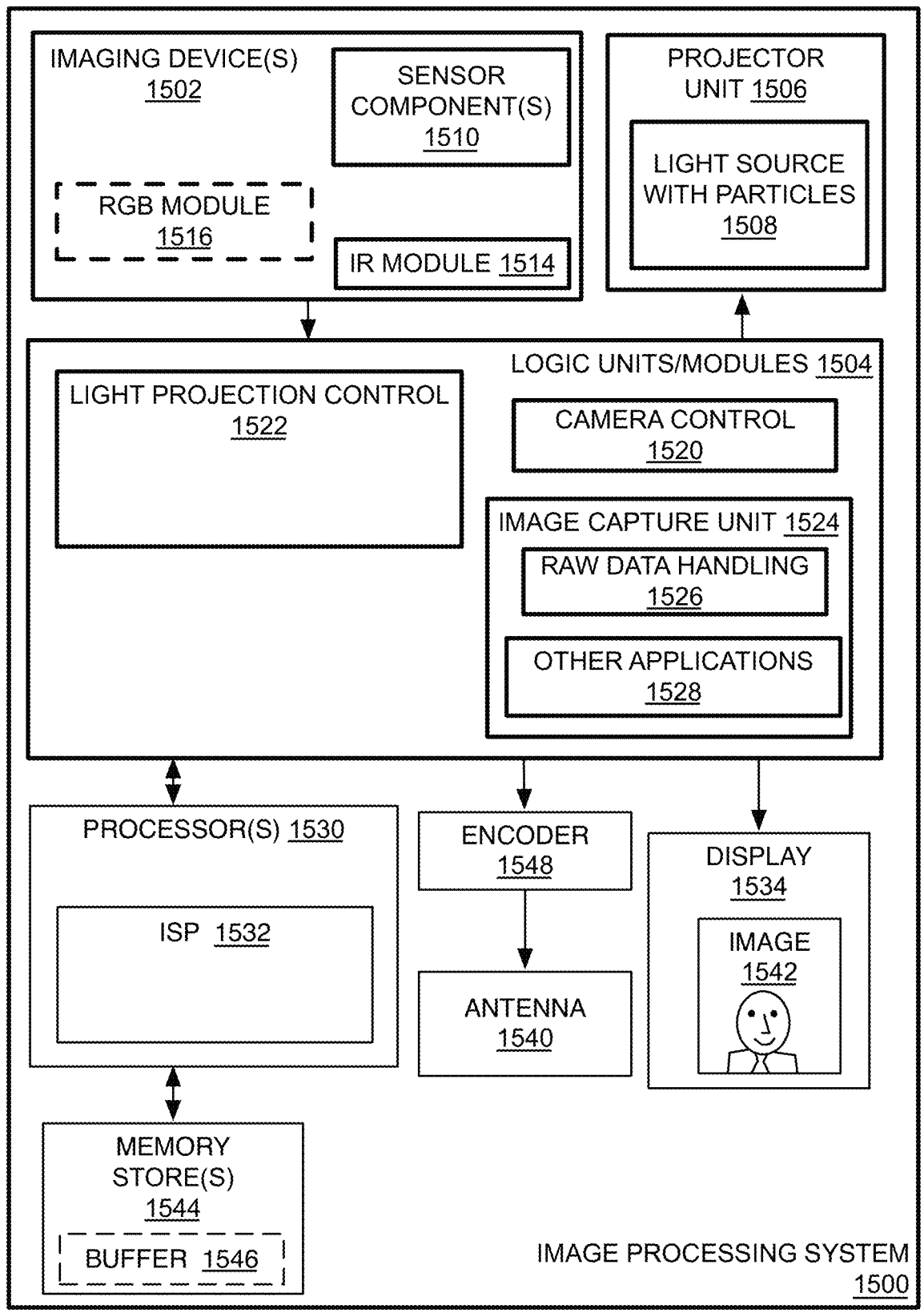
FIG. 15 is an illustrative diagram of an example light emitting and image processing system.

Referring to FIG. 15, an example image processing system 1500 is arranged in accordance with at least some implementations of the present disclosure. In various implementations, the example image processing system 1500 may have an imaging device 1502 to form or receive captured image data, and a projector unit 1506 to emit light to be reflected from objects and captured by the imaging device 1502. This can be implemented in various ways. Thus, in one form, the image processing system 1500 may be a digital camera or other image capture device (such as a dedicated camera), and imaging device 1502, in this case, may be the camera hardware and camera sensor software, module, or component 1510, while the projector unit 1506 is the projector hardware including a light source 1508 with particles as described above, and may have projector software, modules or components as well. In other examples, image processing device 1500 may be a multi-purpose electronic device, such as on a smartphone or laptop for example, and may have an imaging device 1502, that includes or may be a camera, and the projector unit 1506. In either case, logic modules 1504 may communicate remotely with, or otherwise may be communicatively coupled to, the imaging device 1502 and projector unit 1506 for further processing of the image data.

Also in either case, such technology may include a camera such as a digital camera system, a dedicated camera device, or an imaging phone, whether a still picture or video camera or some combination of both. This may include a light projection and camera system such as a face detection, iris detection, or detection of other parts on a person to authorize an action or access for that person. Such a system may be provided on a multi-purpose computing device for access to that device, files on that device, or access to other objects, or could be part of a dedicated access authorization system such as a door or safe lock. Other forms for the image processing device 1500 may include a camera sensor-type imaging device or the like (for example, a webcam or webcam sensor or other complementary metal-oxide-semiconductor-type image sensor (CMOS)), with or without the use of a (RGB) depth camera and/or microphone-array to locate who is speaking. The camera sensor may also support other types of electronic shutters, such as global shutter in addition to, or instead of, rolling shutter, and many other shutter types. In other examples, an RGB-Depth camera may be used in addition to or in the alternative to a camera sensor. This may include an RGB-IR stereo camera or single camera.

In one form, imaging device 1502 may include camera hardware and optics including one or more sensors as well as auto-focus, zoom, aperture, ND-filter, auto-exposure, flash (if not provided by projector unit 1506), and actuator controls. These controls may be part of the sensor module or component 1510 for operating the sensor. The sensor component 1510 may be part of the imaging device 1502, or may be part of the logical modules 1504 or both. Such sensor component can be used to generate images for a viewfinder and take still pictures or video. The sensor component 1510 may be arranged to sense IR light, RGB light, or both. A bandpass filter (BPF) unit (not shown) may provide filters for IR light, RGB light (such as with a Bayer color filter), or both as well. The imaging device 1502 also may have a lens, an analog amplifier, an A/D converter, an IR module 1514, optionally an RGB module 1516, and other components to convert incident light into a digital signal, the like, and/or combinations thereof, and provide statistical signals and data desired for analysis of an IR image for example (which may or may not include a computed SNR or the signals for another application to compute the SNR). The digital signal also may be referred to as the raw image data herein.

The projector unit 1506 may have those components necessary to operate the light source with the phase scrambling particles, whether the light source is only an IR or NIR VCSEL, or additionally includes other type of light source to emit IR or another type of light such as an LED. Thus, the projector unit 1506 may include circuitry to control the power fed to the light source 1508 as well as one or more clock circuits to indicate when to turn the light source on and off. The light source 1508 may include one or more arrays of VCSELs with the phase scrambling particles by the above examples. The projection module 1506 also may include other light sources, such as for the camera flash, or to provide additional types of light than IR.

In the illustrated example, the logic modules 1504 may include a camera control unit 1520 that manages the various general operations of the imaging device 1502 such as turning the camera on and off and transmits data from the imaging device, a light projection control 1522 that controls the power and lighting circuits of the projector unit 1506, an image capture unit 1524 that has a raw data handling unit 1526 that performs pre-processing on received image data, and then other image processing applications 1528 that process the image data for various purposes such as object detection including face or iris detection, eye tracking, image warping or augmentation, depth detection operations, and so forth. The applications 1528 also may include applications that compute and/or use the SNRs to analyze IR images, and if the SNR is not already computed or a signal provided by the IR module 1514 for example.

The image processing system 1500 may have one or more of processors 1530 which may include a dedicated image signal processor (ISP) 1532 such as the Intel Atom, memory stores 1544 with RAM, cache, and/or other memory types, one or more displays 1534, encoder 1548, and antenna 1540. In one example implementation, the image processing system 1500 may have the display 1534, at least one processor 1530 communicatively coupled to the display, at least one memory 1544 communicatively coupled to the processor, and having a buffer 1546 by one example for storing image data and other data related to projector unit 1506 and/or imaging device 1502. The encoder 1548 and antenna 1540 may be provided to compress the modified image date for transmission to other devices that may display or store the image. It will be understood that the image processing system 1500 may also include a decoder (or encoder 1548 may include a decoder) to receive and decode image data for processing by the system 1500. Otherwise, the processed image 1542 may be displayed on display 1534 or stored in memory 1544. As illustrated, any of these components may be capable of communication with one another and/or communication with portions of logic modules 1504, projector unit 1506, and/or imaging device 1502. Thus, processors 1530 may be communicatively coupled to the imaging device 1502, projector unit 1506, and the logic modules 1504 for operating those components. By one approach, although image processing system 1500, as shown in FIG. 15, may include one particular set of blocks or actions associated with particular components, units, or modules, these blocks or actions may be associated with different components, units, or modules than the particular component, unit, or module illustrated here.

Figure 16:
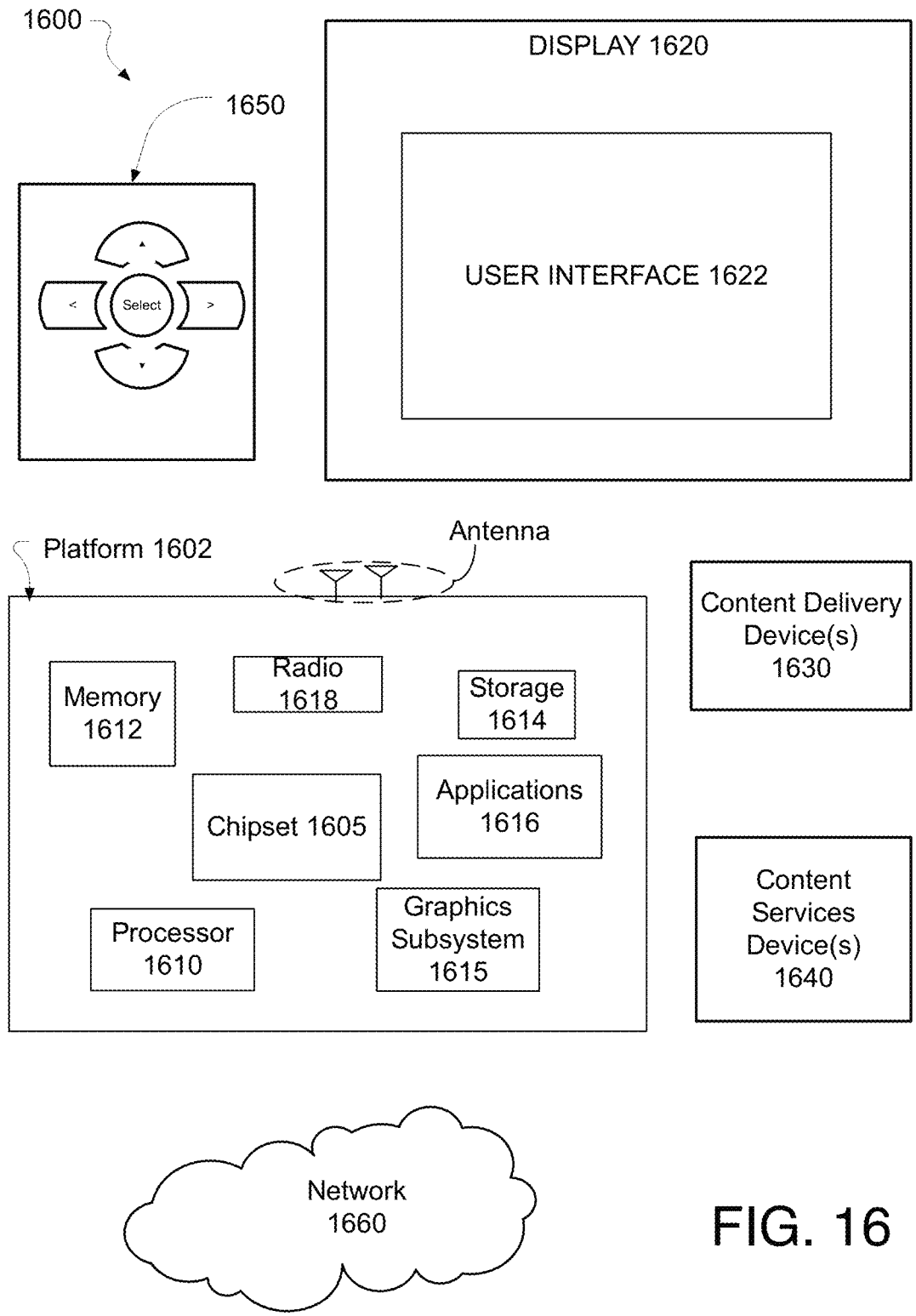
FIG. 16 is an illustrative diagram of an example system.

Referring to FIG. 16, an example system 1600 in accordance with the present disclosure operates one or more aspects of the image processing systems described herein and may operate or include system 1500. It will be understood from the nature of the system components described below that such components may be associated with, or used to operate, certain part or parts of the image processing system described above. In various implementations, system 1600 may be a media system although system 1600 is not limited to this context. For example, system 1600 may be incorporated into a digital still camera, digital video camera, mobile device with camera or video functions such as an imaging phone, webcam, personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, dedicated access authorization device, physical lock device, face login device, object detection device, and so forth.

In various implementations, system 1600 includes a platform 1602 coupled to a display 1620. Platform 1602 may receive content from a content device such as content services device(s) 1630 or content delivery device(s) 1640 or other similar content sources. A navigation controller 1650 including one or more navigation features may be used to interact with, for example, platform 1602 and/or display 1620. Each of these components is described in greater detail below.

In various implementations, platform 1602 may include any combination of a chipset 1605, processor 1610, memory 1612, storage 1614, graphics subsystem 1615, applications 1616 and/or radio 1618. Chipset 1605 may provide intercommunication among processor 1610, memory 1612, storage 1614, graphics subsystem 1615, applications 1616 and/or radio 1618. For example, chipset 1605 may include a storage adapter (not depicted) capable of providing intercommunication with storage 1614.

Processor 1610 may be implemented as a Complex Instruction Set Computer (CISC) or Reduced Instruction Set Computer (RISC) processors; x86 instruction set compatible processors, multi-core, or any other microprocessor or central processing unit (CPU). In various implementations, processor 1610 may be dual-core processor(s), dual-core mobile processor(s), and so forth.

Memory 1612 may be implemented as a volatile memory device such as, but not limited to, a Random Access Memory (RAM), Dynamic Random Access Memory (DRAM), or Static RAM (SRAM).

Storage 1614 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 1614 may include technology to increase the storage performance enhanced protection for valuable digital media when multiple hard drives are included, for example.

Graphics subsystem 1615 may perform processing of images such as still or video for display. Graphics subsystem 1615 may be a graphics processing unit (GPU) or a visual processing unit (VPU), for example. An analog or digital interface may be used to communicatively couple graphics subsystem 1615 and display 1620. For example, the interface may be any of a High-Definition Multimedia Interface, Display Port, wireless HDMI, and/or wireless HD compliant techniques. Graphics subsystem 1615 may be integrated into processor 1610 or chipset 1605. In some implementations, graphics subsystem 1615 may be a stand-alone card communicatively coupled to chipset 1605.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general purpose processor, including a multi-core processor. In further implementations, the functions may be implemented in a consumer electronics device.

Radio 1618 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 1618 may operate in accordance with one or more applicable standards in any version.

In various implementations, display 1620 may include any television type monitor or display. Display 1620 may include, for example, a computer display screen, touch screen display, video monitor, television-like device, and/or a television. Display 1620 may be digital and/or analog. In various implementations, display 1620 may be a holographic display. Also, display 1620 may be a transparent surface that may receive a visual projection. Such projections may convey various forms of information, images, and/or objects. For example, such projections may be a visual overlay for a mobile augmented reality (MAR) application. Under the control of one or more software applications 1616, platform 1602 may display user interface 1622 on display 1620.

In various implementations, content services device(s) 1630 may be hosted by any national, international and/or independent service and thus accessible to platform 1602 via the Internet, for example. Content services device(s) 1630 may be coupled to platform 1602 and/or to display 1620.

Platform 1602 and/or content services device(s) 1630 may be coupled to a network 1660 to communicate (e.g., send and/or receive) media information to and from network 1660. Content delivery device(s) 1640 also may be coupled to platform 1602 and/or to display 1620.

In various implementations, content services device(s) 1630 may include a cable television box, personal computer, network, telephone, Internet enabled devices or appliance capable of delivering digital information and/or content, and any other similar device capable of unidirectionally or bidirectionally communicating content between content providers and platform 1602 and/display 1620, via network 1660 or directly. It will be appreciated that the content may be communicated unidirectionally and/or bidirectionally to and from any one of the components in system 1600 and a content provider via network 1660. Examples of content may include any media information including, for example, video, music, medical and gaming information, and so forth.

Content services device(s) 1630 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 1602 may receive control signals from navigation controller 1650 having one or more navigation features. The navigation features of controller 1650 may be used to interact with user interface 1622, for example. In implementations, navigation controller 1650 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 1650 may be replicated on a display (e.g., display 1620) by movements of a pointer, cursor, focus ring, or other visual indicators displayed on the display. For example, under the control of software applications 1616, the navigation features located on navigation controller 1650 may be mapped to virtual navigation features displayed on user interface 1622, for example. In implementations, controller 1650 may not be a separate component but may be integrated into platform 1602 and/or display 1620. The present disclosure, however, is not limited to the elements or in the context shown or described herein.

In various implementations, drivers (not shown) may include technology to enable users to instantly turn on and off platform 1602 like a television with the touch of a button after initial boot-up, when enabled, for example. Program logic may allow platform 1602 to stream content to media adaptors or other content services device(s) 1630 or content delivery device(s) 1640 even when the platform is turned "off." In addition, chipset 1605 may include hardware and/or software support for 8.1 surround sound audio and/or high definition (7.1) surround sound audio, for example. Drivers may include a graphics driver for integrated graphics platforms. In implementations, the graphics driver may comprise a peripheral component interconnect (PCI) Express graphics card.

In various implementations, any one or more of the components shown in system 1600 may be integrated. For example, platform 1602 and content services device(s) 1630 may be integrated, or platform 1602 and content delivery device(s) 1640 may be integrated, or platform 1602, content services device(s) 1630, and content delivery device(s) 1640 may be integrated, for example. In various implementations, platform 1602 and display 1620 may be an integrated unit. Display 1620 and content service device(s) 1630 may be integrated, or display 1620 and content delivery device(s) 1640 may be integrated, for example. These examples are not meant to limit the present disclosure.

In various implementations, system 1600 may be implemented as a wireless system, a wired system, or a combination of both. When implemented as a wireless system, system 1600 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 1600 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 1602 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The implementations, however, are not limited to the elements or in the context shown or described in FIG. 16.

Figure 17:
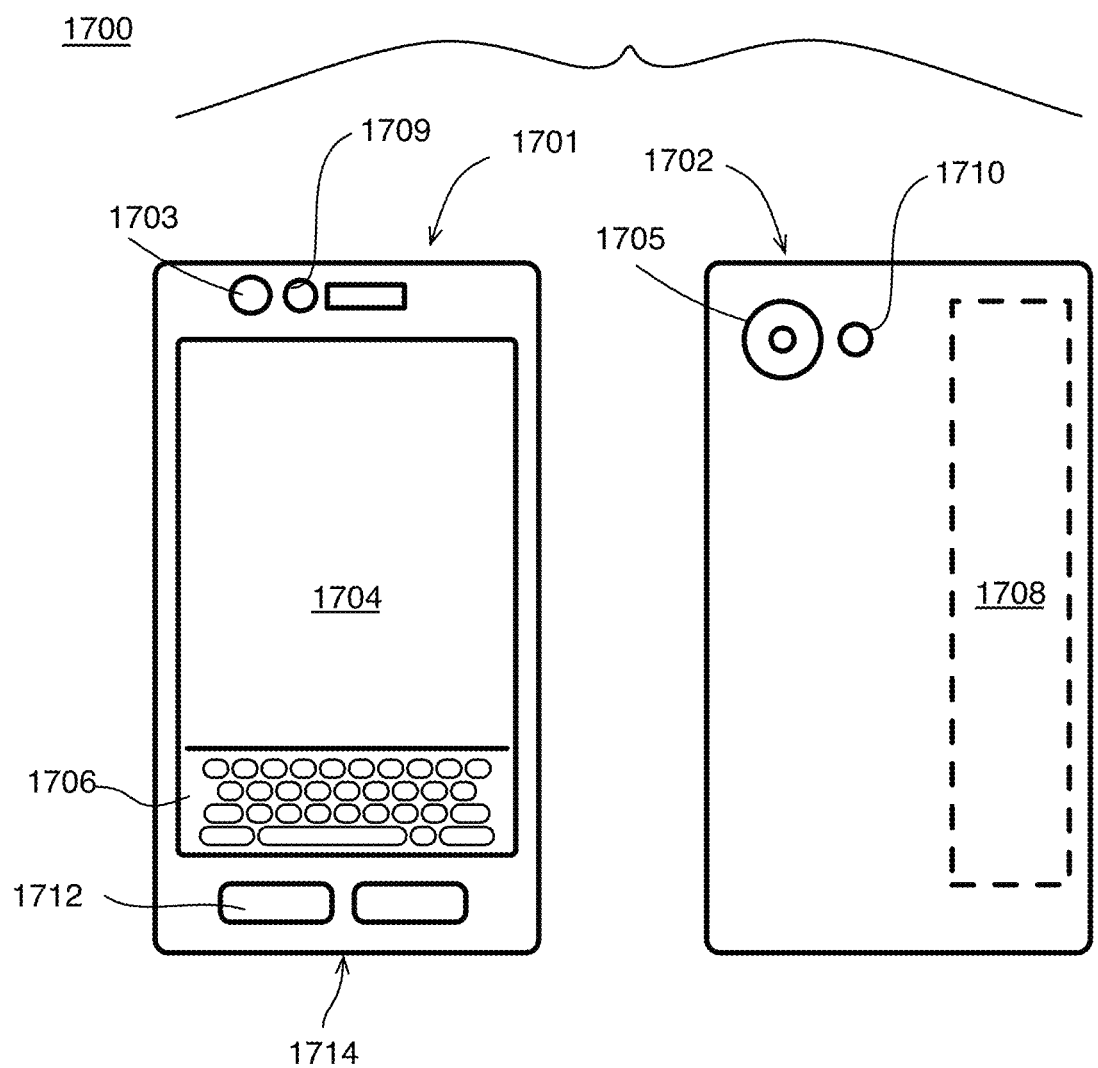
FIG. 17 is an illustrative diagram of an example system, all arranged in accordance with at least some implementations of the present disclosure.

Referring to FIG. 17, a small form factor device 1700 is one example of the varying physical styles or form factors in which systems 1500 or 1600 may be embodied. By this approach, device 1500 may be implemented as a mobile computing device having wireless capabilities. A mobile computing device may refer to any device having a processing system and a mobile power source or supply, such as one or more batteries, for example.

As described above, examples of a mobile computing device may include a digital still camera, digital video camera, mobile devices with camera or video functions such as imaging phones, webcam, personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various implementations, for example, a mobile computing device may be implemented as a smart phone capable of executing computer applications, as well as voice communications and/or data communications. Although some implementations may be described with a mobile computing device implemented as a smart phone by way of example, it may be appreciated that other implementations may be implemented using other wireless mobile computing devices as well. The implementations are not limited in this context.

As shown in FIG. 17, device 1700 may include a housing with a front 1701 and a back 1702. Device 1700 includes a display 1704, an input/output (I/O) device 1706, and an integrated antenna 1708. Device 1700 also may include navigation features 1712. I/O device 1706 may include any suitable I/O device for entering information into a mobile computing device. Examples for I/O device 1706 may include an alphanumeric keyboard, a numeric keypad, a touch pad, input keys, buttons, switches, microphones, speakers, voice recognition device and software, and so forth. Information also may be entered into device 1700 by way of microphone 1714, or may be digitized by a voice recognition device. As shown, device 1700 may include a camera 1705 (e.g., including at least one lens, aperture, and imaging sensor) and a flash 1710 integrated into back 1702 (or elsewhere) of device 1700. The implementations are not limited in this context.

Various forms of the devices and processes described herein may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an implementation is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one implementation may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to additional implementations.

By an example one or more first implementations, an illuminator comprises at least one stack of layers including at least one light emitting layer; and multiple groups of phase scrambling particles deposited on an individual light emitting layer so that at least one of the light emitting layers has the multiple groups, wherein each group has the particles spaced from each other, wherein the multiple groups comprising intentional variation between at least two of the groups in at least one of: sizes of the particles, at least one material forming the particles, and spacing between the particles.

By one or more second implementations, and further to the first implementation, wherein the variation is sufficient to reduce speckle caused by light emitted by the illuminator.

By one or more third implementations, and further to the first or second implementation, wherein the particles form a monolayer of particles on the light emitting layer and are randomly positioned relative to each other within the group.

By one or more fourth implementations, and further to any of the first to third implementation, wherein the particles have a diameter approximately ¼ to ½ a dominant wavelength of light generated by the illuminator before intersecting the particles.

By one or more fifth implementations, and further to any of the first to fourth implementation, wherein the particles are nanoparticles have a diameter of about 4 nm to 15 nm or about 45 nm to 650 nm.

By one or more sixth implementations, and further to any of the first to fifth implementation, wherein the particles are spherical or ellipsoidal on the light emitting layer.

By one or more seventh implementations, and further to any of the first to sixth implementation, wherein the particles are formed of a material transparent to infrared or near infrared light.

By one or more eighth implementations, and further to any of the first to seventh implementation, wherein the particles are formed of at least one of: indium phosphide, gallium phosphide, aluminum oxide, titanium oxide, zinc oxide, zirconium dioxide, aluminum oxide, silicon dioxide, or silicon.

By one or more ninth implementations, and further to any of the first to eighth implementation, wherein the light emitting layer is a transparent layer having a material of at least one of: indium phosphide, gallium phosphide, aluminum oxide, titanium oxide, zinc oxide, zirconium dioxide, aluminum oxide, silicon dioxide, or silicon to form bonds with the particles.

By one or more tenth implementations, and further to any of the first to ninth implementation, wherein the material of the light emitting layer is selected to be functionalized to bond to functionalized versions of the particles.

By one or more eleventh implementations, and further to any of the first to tenth implementation, wherein the particles are formed on the light emitting layer by using spatial liquid phase atomic layer deposition (SLP-ALD) without applying heat to raise temperature above about 78° F.

By one or more twelfth implementations, and further to any of the first to eleventh implementation, wherein the particles are formed of a dielectric core and a dielectric shell.

By one or more thirteenth implementations, and further to any of the first to eleventh implementation, wherein the particles are formed of a dielectric core and a dielectric shell, and wherein the shell completely surrounds the core.

By one or more fourteenth implementations, and further to any of the first to eleventh implementation, wherein the particles are formed of a dielectric core and a dielectric shell, and wherein the core is exposed on the particle and contacts the light emitting layer.

By one or more fifteenth implementations, and further to any of the first to fourteenth implementation, wherein the illuminator has at least one vertical-cavity surface emitting laser (VCSEL) and the particles are bonded to the light emitting layer to form an integrally formed phase scrambling layer of the VCSEL.

By one or more sixteenth implementations, and further to any of the first to fifteenth implementation, wherein the multiple groups are disposed on a single VCSEL and each group covers an area on the VCSEL that is not the same area as at least one of the other groups.

By an example seventeenth implementation, a system of image processing comprises an illuminator comprising at least one stack of layers including a light emitting layer, and multiple groups of phase scrambling particles deposited on at least one of the light emitting layers wherein each group has the particles spaced from each other; wherein the multiple groups comprise intentional variation between at least two of the groups in at least one of: sizes of the particles, at least one material forming the particles, and spacing between the particles; and at least one sensor to sense the light emitted from the illuminator.

By one or more eighteenth implementations, and further to the seventeenth implementation, wherein the illuminator comprises at least one VCSEL array, and at least one of the individual VCSELs only has one of the groups.

By one or more nineteenth implementations, and further to the seventeenth implementation, wherein the illuminator comprises at least one VCSEL array, and at least one of the VCSELs has multiple groups.

By one or more twentieth implementations, and further to the seventeenth implementation, wherein the illuminator comprises at least one VCSEL array, wherein each VCSEL has multiple groups.

By one or more twenty-first implementations, and further to any the seventeenth implementation to the twentieth implementation, wherein the illuminator comprises a plurality of VCSEL arrays wherein at least one of the arrays having VCSELs of one or more aperture sizes different than the aperture size or sizes of VCSELs of at least one other of the arrays so that the at least one array emits light at a dominant wavelength different than the dominant wavelength of the at least one other array.

By one or more twenty-second implementations, a light emitting device comprises an infra-red (IR) or near-infra-red (NIR) illuminator comprising multiple arrays of vertical-cavity surface emitting lasers (VCSELs) each having a light emitting layer; and wherein the VCSELs of one array have apertures that are a different size than apertures of VCSELs of at least one other array so that the dominant wavelength of the one array and other array is sufficiently different to reduce speckle; and multiple groups of phase scrambling particles deposited on the light emitting layers wherein each group has the particles spaced from each other, the multiple groups comprising intentional variation between at least two of the groups in at least one of: sizes of the particles, at least one material forming the particles, and spacing between the particles.

By one or more twenty-third implementations, and further to the twenty-second implementation, wherein individual VCSELs each have the multiple groups.

By one or more twenty-fourth implementations, and further to the twenty-second implementation, wherein individual VCSELs each have the multiple groups, and wherein an area of each group covering the light emitting layer of the VCSEL is set randomly so that at least two of the groups have different areas on the same light emitting layer.

By one or more twenty-fifth implementations, and further to the twenty-second implementation, wherein the multiple groups are formed on a single light emitting layer so that the groups do not substantially overlap and are formed by selective area atomic layer deposition.

In one or more twenty-sixth implementations, a device or system includes a memory and a processor to perform a method according to any one of the above implementations.

In one or more twenty-seventh implementations, at least one machine readable medium includes a plurality of instructions that in response to being executed on a computing device, cause the computing device to perform a method according to any one of the above implementations.

In one or more twenty-eighth implementations, an apparatus may include means for performing a method according to any one of the above implementations.

The above examples may include specific combination of features. However, the above examples are not limited in this regard and, in various implementations, the above examples may include undertaking only a subset of such features, undertaking a different order of such features, undertaking a different combination of such features, and/or undertaking additional features than those features explicitly listed. For example, all features described with respect to any example methods herein may be implemented with respect to any example apparatus, example systems, and/or example articles, and vice versa.

What is claimed is:

1. An illuminator comprising:
   at least one stack of layers including at least one light emitting layer; and
   multiple groups of phase scrambling particles deposited on an individual light emitting layer so that at least one of the light emitting layers has the multiple groups, wherein each group has the particles spaced from each other, wherein the multiple groups comprising intentional variation between at least two of the groups in at least one of: sizes of the particles, at least one material forming the particles, and spacing between the particles.

2. The illuminator of claim 1 wherein the variation is sufficient to reduce speckle caused by light emitted by the illuminator.

3. The illuminator of claim 1 wherein the particles form a monolayer of particles on the light emitting layer and are randomly positioned relative to each other within the group.

4. The illuminator of claim 1 wherein the particles have a diameter approximately ¼ to ½ a dominant wavelength of light generated by the illuminator before intersecting the particles.

5. The illuminator of claim 1 wherein the particles have a diameter of about 4 nm to 15 nm or about 45 nm to 650 nm.

6. The illuminator of claim 1 wherein the particles are spherical or ellipsoid on the light emitting layer.

7. The illuminator of claim 1 wherein the particles are formed of a material transparent to infrared or near infrared light.

8. The illuminator of claim 1 wherein the particles are formed of at least one of: indium phosphide, gallium phosphide, aluminum oxide, titanium oxide, zinc oxide, zirconium dioxide, aluminum oxide, silicon dioxide, or silicon.

9. The illuminator of claim 1 wherein the light emitting layer is a transparent layer having a material of at least one of: indium phosphide, gallium phosphide, aluminum oxide, titanium oxide, zinc oxide, zirconium dioxide, aluminum oxide, silicon dioxide, or silicon to form bonds with the particles.

10. The illuminator of claim 1 wherein the material of the light emitting layer is selected to be functionalized to bond to functionalized versions of the particles.

11. The illuminator of claim 1 wherein the particles are formed on the light emitting layer by using spatial liquid phase atomic layer deposition (SLP-ALD) without applying heat to raise temperature above about 78° F.

12. The illuminator of claim 1 wherein the particles are formed of a dielectric core and a dielectric shell.

13. The illuminator of claim 12 wherein the shell completely surrounds the core.

14. The illuminator of claim 12 wherein the core is exposed on the particle and contacts the light emitting layer.

15. The illuminator of claim 1 wherein the illuminator is at least one vertical-cavity surface emitting laser (VCSEL) and the particles are bonded to the light emitting layer to form an integrally formed phase scrambling layer of the VCSEL.

16. The illuminator of claim 1 wherein the multiple groups are disposed on a single VCSEL and each group covers a random area on the VCSEL that is not the same area as at least one of the other groups.

17. A system of image processing comprising:
an illuminator comprising:
at least one stack of layers including a light emitting layer, and
multiple groups of phase scrambling particles deposited on at least one of the light emitting layers wherein each group has the particles spaced from each other; wherein the multiple groups comprise intentional variation between at least two of the groups in at least one of: sizes of the particles, at least one material forming the particles, and spacing between the particles; and
at least one sensor to sense the light emitted from the illuminator.

18. The system of claim 17 wherein the illuminator comprises at least one VCSEL array, and at least one of the individual VCSELs only has one of the groups.

19. The system of claim 17 wherein the illuminator comprises at least one VCSEL array, and at least one of the VCSELs has multiple groups.

20. The system of claim 19 wherein each VCSEL has multiple groups.

21. The system of claim 17 wherein the illuminator comprises a plurality of VCSEL arrays wherein at least one of the arrays having VCSELs of one or more aperture sizes different than the aperture size or sizes of VCSELs of at least one other of the arrays so that the at least one array emits light at a dominant wavelength different than the dominant wavelength of the at least one other array.

22. A light emitting device comprising:
an infra-red (IR) or near-infra-red (NIR) illuminator comprising multiple arrays of vertical-cavity surface emitting lasers (VCSELs) each having a light emitting layer; and
wherein the VCSELs of one array have apertures that are a different size than apertures of VCSELs of at least one other array so that the dominant wavelength of the one array and other array is sufficiently different to reduce speckle; and
multiple groups of phase scrambling particles deposited on the light emitting layers wherein each group has the particles spaced from each other, the multiple groups comprising intentional variation between at least two of the groups in at least one of: sizes of the particles, at least one material forming the particles, and spacing between the particles.

23. The device of claim 22 wherein individual VCSELs each have the multiple groups.

24. The device of claim 23 wherein an area of each group covering the light emitting layer of the VCSEL is set randomly so that at least two of the groups have different areas on the same light emitting layer.

25. The device of claim 22 wherein the multiple groups are formed on a single light emitting layer so that the groups do not substantially overlap and are formed by selective area atomic layer deposition.

* * * * *